United States Patent
Mukai et al.

(10) Patent No.: US 12,278,423 B2
(45) Date of Patent: Apr. 15, 2025

(54) TERAHERTZ ELEMENT AND SEMICONDUCTOR DEVICE

(71) Applicant: ROHM CO., LTD., Kyoto (JP)

(72) Inventors: Toshikazu Mukai, Kyoto (JP); Jaeyoung Kim, Kyoto (JP); Tomoichiro Toyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 44 days.

(21) Appl. No.: 18/322,326

(22) Filed: May 23, 2023

(65) Prior Publication Data

US 2023/0378640 A1 Nov. 23, 2023

Related U.S. Application Data

(63) Continuation of application No. 17/644,225, filed on Dec. 14, 2021, now Pat. No. 11,699,846, which is a
(Continued)

(30) Foreign Application Priority Data

Jun. 27, 2017 (JP) .................................. 2017-125370
Oct. 18, 2017 (JP) .................................. 2017-202021

(51) Int. Cl.
*H01Q 1/38* (2006.01)
*H01L 23/00* (2006.01)
(Continued)

(52) U.S. Cl.
CPC ............... *H01Q 1/38* (2013.01); *H01L 23/66* (2013.01); *H01L 24/48* (2013.01);
(Continued)

(58) Field of Classification Search
CPC ........... H01Q 1/38; H01L 23/66; H01L 24/48; H01L 27/0676; H01L 2223/6672; H01L 2223/6677; H01L 2224/48225
See application file for complete search history.

(56) References Cited

U.S. PATENT DOCUMENTS

2001/0005044 A1* 6/2001 Fjelstad ............. H01L 23/3121
257/E23.125
2010/0026401 A1 2/2010 Mukai et al.
(Continued)

FOREIGN PATENT DOCUMENTS

DE 10 2015 208 657 A1 12/2015
JP 3-21857 U 3/1991
(Continued)

OTHER PUBLICATIONS

International Search Report issued in PCT/JP2018/024179, Aug. 28, 2018 (2 pages).
(Continued)

*Primary Examiner* — Tucker J Wright
(74) *Attorney, Agent, or Firm* — HSML P.C.

(57) ABSTRACT

A terahertz element of an aspect of the present disclosure includes a semiconductor substrate, first and second conductive layers, and an active element. The first and second conductive layers are on the substrate and mutually insulated. The active element is on the substrate and electrically connected to the first and second conductive layers. The first conductive layer includes a first antenna part extending along a first direction, a first capacitor part offset from the active element in a second direction as viewed in a thickness direction of the substrate, and a first conductive part connected to the first capacitor part. The second direction is perpendicular to the thickness direction and first direction. The second conductive layer includes a second capacitor part, stacked over and insulated from the first capacitor part. The substrate includes a part exposed from the first and second capacitor parts. The first conductive part has a portion spaced apart from the first antenna part in the second direction with the exposed part therebetween as viewed in the thickness direction.

11 Claims, 20 Drawing Sheets

Related U.S. Application Data continuation of application No. 16/619,440, filed as application No. PCT/JP2018/024179 on Jun. 26, 2018, now Pat. No. 11,239,547.

(51) Int. Cl.
*H01L 23/66* (2006.01)
*H01L 27/06* (2006.01)
*H01L 29/88* (2006.01)
*H01Q 9/16* (2006.01)

(52) U.S. Cl.
CPC ........ *H01L 27/0676* (2013.01); *H01L 29/882* (2013.01); *H01L 2223/6672* (2013.01); *H01L 2223/6677* (2013.01); *H01L 2224/48225* (2013.01); *H01Q 9/16* (2013.01)

(56) References Cited

U.S. PATENT DOCUMENTS

| | | |
|---|---|---|
| 2014/0209802 A1 | 7/2014 | Itsuji |
| 2014/0326890 A1 | 11/2014 | Debray et al. |
| 2015/0364535 A1 | 12/2015 | Triyoso et al. |
| 2018/0152141 A1* | 5/2018 | Koyama ........... H01L 31/02327 |

FOREIGN PATENT DOCUMENTS

| | | |
|---|---|---|
| JP | 2004-335805 A | 11/2004 |
| JP | 2009-80448 A | 4/2009 |
| JP | 2010-135453 A | 6/2010 |
| JP | 2010-135500 A | 6/2010 |
| JP | 2016-111542 A | 6/2016 |
| JP | 2016-158023 A | 9/2016 |
| JP | 2016-213732 A | 12/2016 |
| WO | 2016/092886 A1 | 6/2016 |

OTHER PUBLICATIONS

Office Action received in the corresponding German Patent application, Apr. 29, 2021 and corresponding machine translation (22 pages).

Office Action received in the corresponding Chinese Patent application, Feb. 22, 2023, and machine translation (14 pages).

* cited by examiner

FIG.5
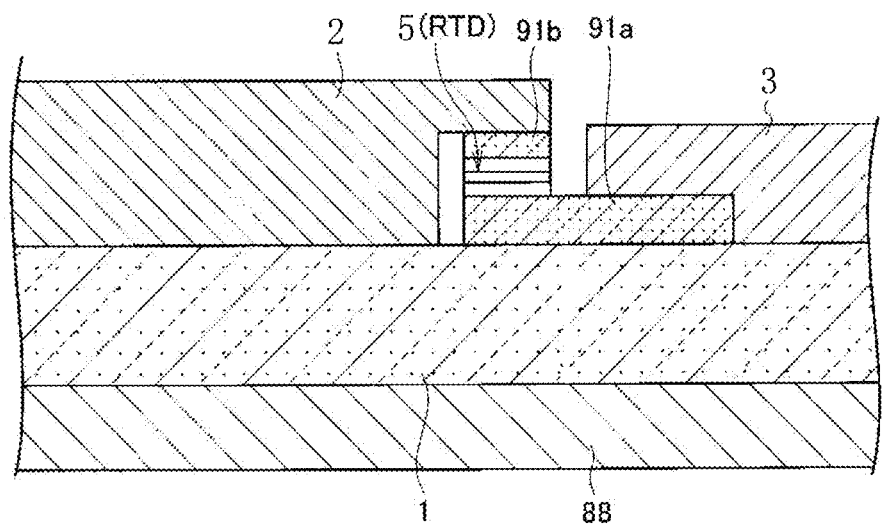
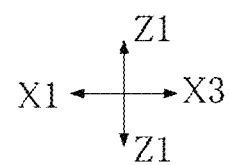

FIG.6
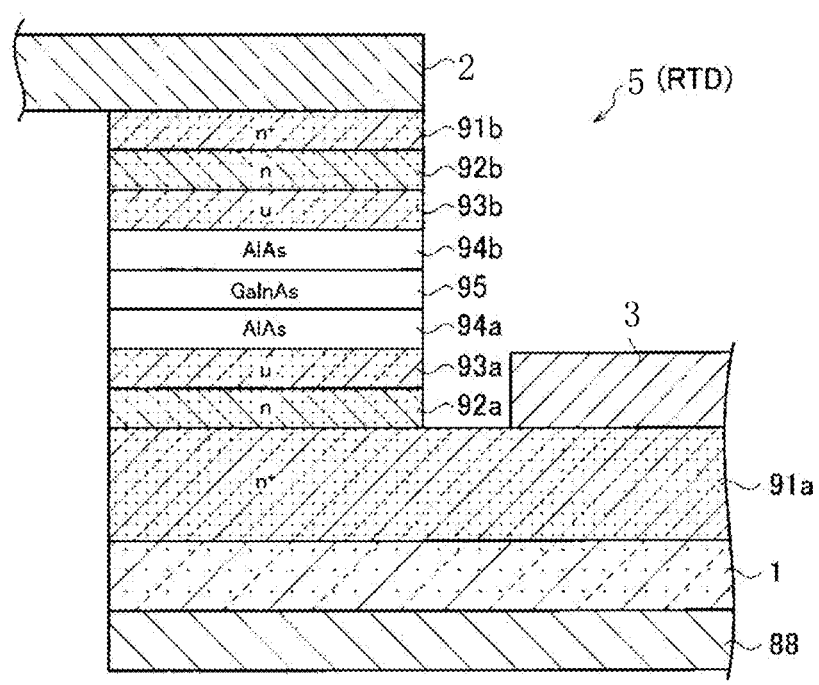
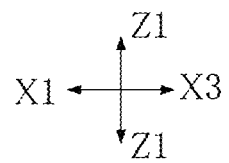

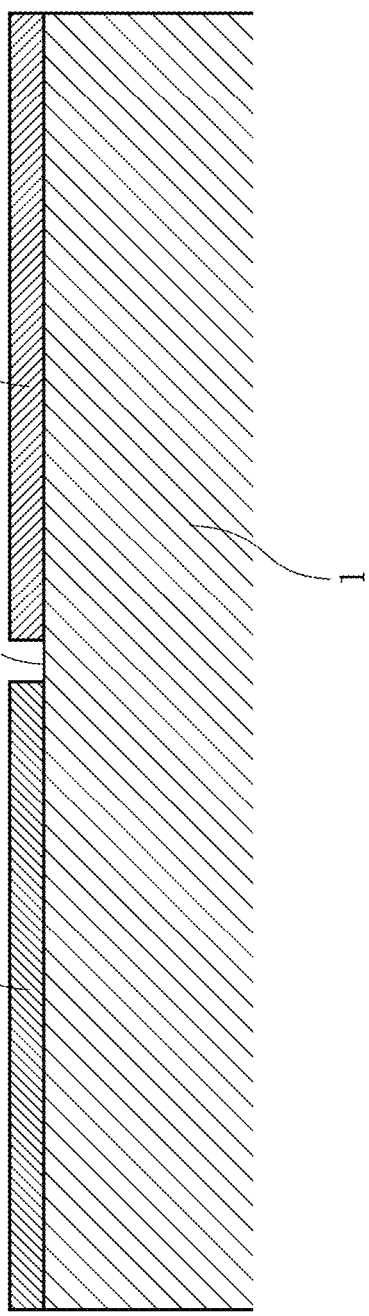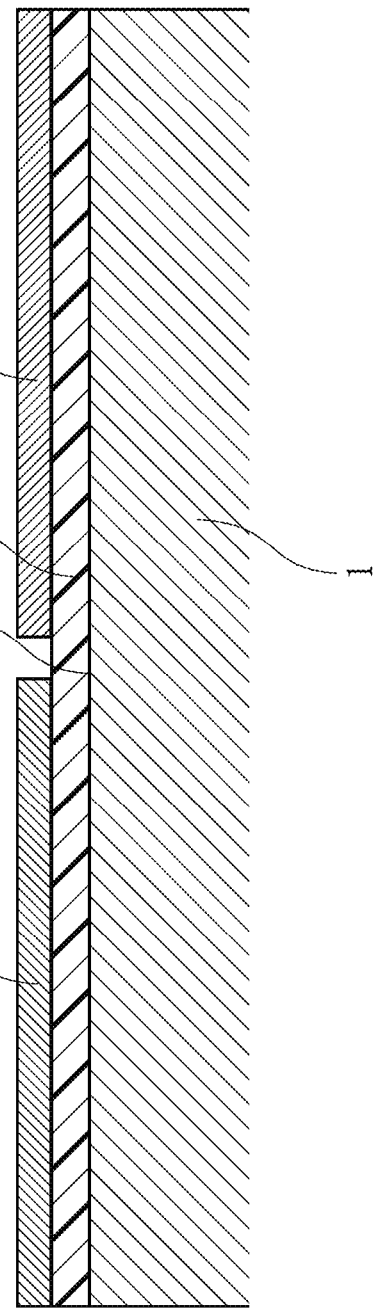

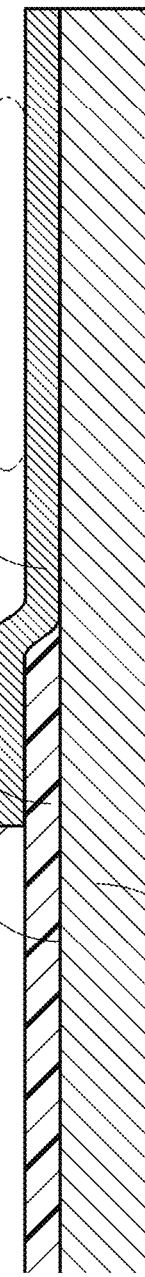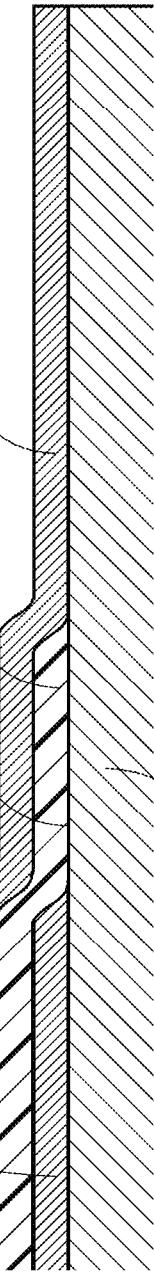

TERAHERTZ ELEMENT AND SEMICONDUCTOR DEVICE

TECHNICAL FIELD

The present disclosure relates to terahertz elements and semiconductor devices.

BACKGROUND ART

In recent years, as electronic devices such as transistors are miniaturized and their sizes are reduced to nano-scale, a new phenomenon called quantum effect has been observed. Studies are being made to develop an ultra-high speed device or a new function device utilizing the quantum effect. In particular, attempts are being made to utilize the frequency range of 0.1 to 10 THz, called a terahertz band, to perform high-capacity communication or information processing, imaging and measurement, for example. This frequency region is an undeveloped region between light and radio waves, and a device that operates in this frequency band, if realized, could be used for many applications such as imaging and high-capacity communication or information processing described above, as well as measurement in various fields such as physical properties, astronomy or biology.

SUMMARY OF THE INVENTION

According to a first aspect of the present disclosure, a terahertz element is provided. The terahertz element includes a semiconductor substrate, a first conductive layer, a second conductive layer and an active element. The first conductive layer and the second conductive layer each are famed on the semiconductor substrate and insulated from each other. The active element is famed on the semiconductor substrate and electrically connected to the first conductive layer and the second conductive layer. The first conductive layer includes a first antenna part extending along a first direction, a first capacitor part positioned offset from the active element in a second direction as viewed in a thickness direction of the semiconductor substrate, and a first conductive part connected to the first capacitor part. The second direction is perpendicular to the thickness direction and the first direction. The second conductive layer includes a second capacitor part. The second capacitor part is stacked over the first capacitor part while being insulated from the first capacitor part. The semiconductor substrate includes an exposed part that is exposed from the first capacitor part and the second capacitor part. The first conductive part has a portion that is spaced apart from the first antenna part in the second direction with the exposed part therebetween as viewed in the thickness direction.

According to a second aspect of the present disclosure, a semiconductor device is provided. The semiconductor device includes a support, a terahertz element provided by the first aspect and disposed on the support, and an insulating part disposed on the support. The insulating part is famed with an opening in which the terahertz element is housed. The opening has a first side surface. The first side surface is inclined with respect to a thickness direction of the support.

The description that "an object A is famed on an object B" and "an object A is famed above an object B" includes, unless otherwise suggested, "the object A is famed directly on the object B" and "the object A is famed on the object B with another object interposed between the object A and the object B". Similarly, the description that "an object A is disposed on an object B" and "an object A is disposed above an object B" includes, unless otherwise suggested, "the object A is disposed directly on the object B" and "the object A is disposed on the object B with another object interposed between the object A and the object B". Similarly, the description that "an object A is stacked on an object B" and "an object A is stacked over an object B" includes, unless otherwise suggested, "the object A is stacked directly on the object B" and "the object A is stacked on the object B with another object interposed between the object A and the object B".

BRIEF DESCRIPTION OF THE DRAWINGS

FIG. 5 is a sectional view showing details of an active element of the first embodiment;

FIG. 6 is a view showing a part of FIG. 5 as enlarged;

FIG. 7 is a sectional view taken along line VII-VII in FIG. 2;

FIG. 8 is a sectional view taken along line VIII-VIII in FIG. 2;

FIG. 11 is a sectional view taken along line XI-XI in FIG. 2;

FIG. 12 is a sectional view taken along line XII-XII in FIG. 2;

MODE FOR CARRYING OUT THE INVENTION

Preferred embodiments of the present disclosure are described below with reference to the accompanying drawings.

First Embodiment

Figure 1:
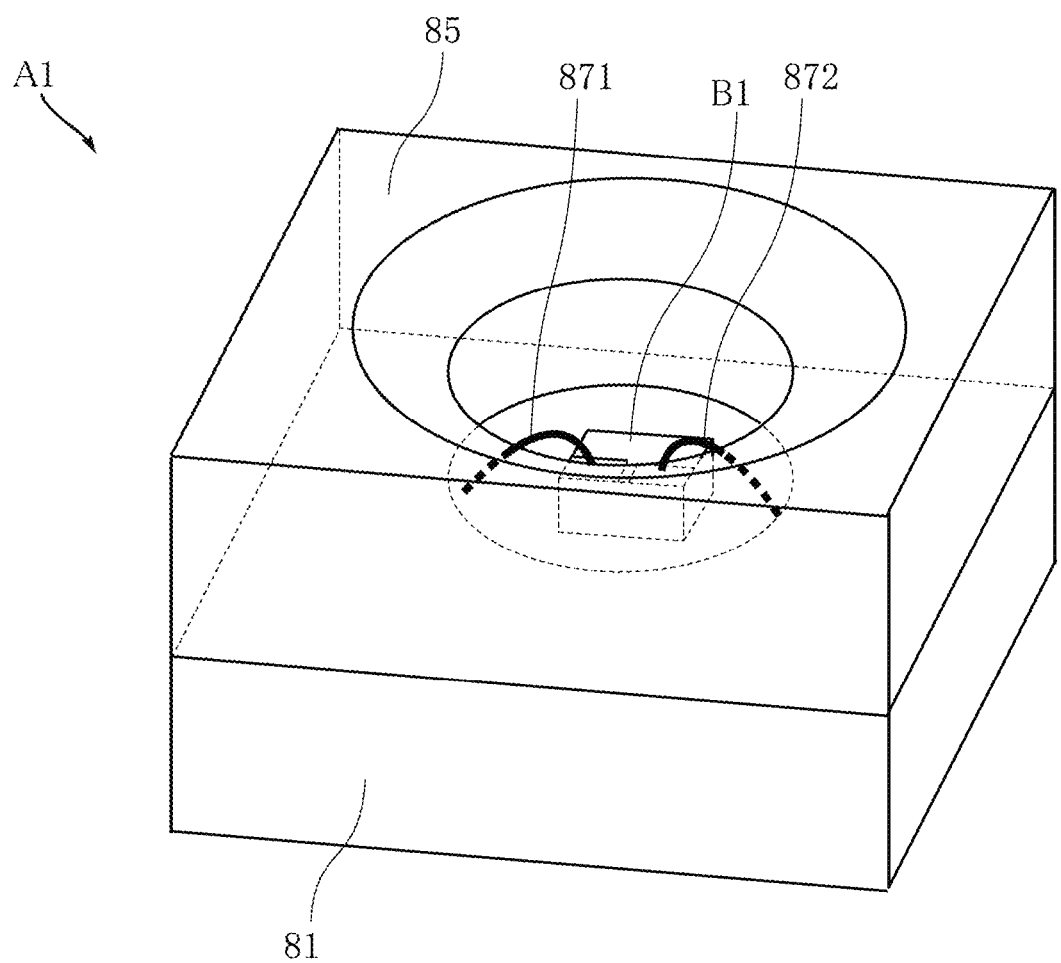
FIG. 1 is a perspective view of a semiconductor device according to a first embodiment.

A first embodiment of the present disclosure is described below with reference to FIGS. 1-17. FIG. 1 is a perspective view of a semiconductor device according to a first embodiment.

The semiconductor device A1 shown in the figure is a terahertz radiator. The semiconductor device A1 includes a terahertz element B1, a support (including a wiring board 81), an insulating part 85 and wires 871, 872.

Figure 2:
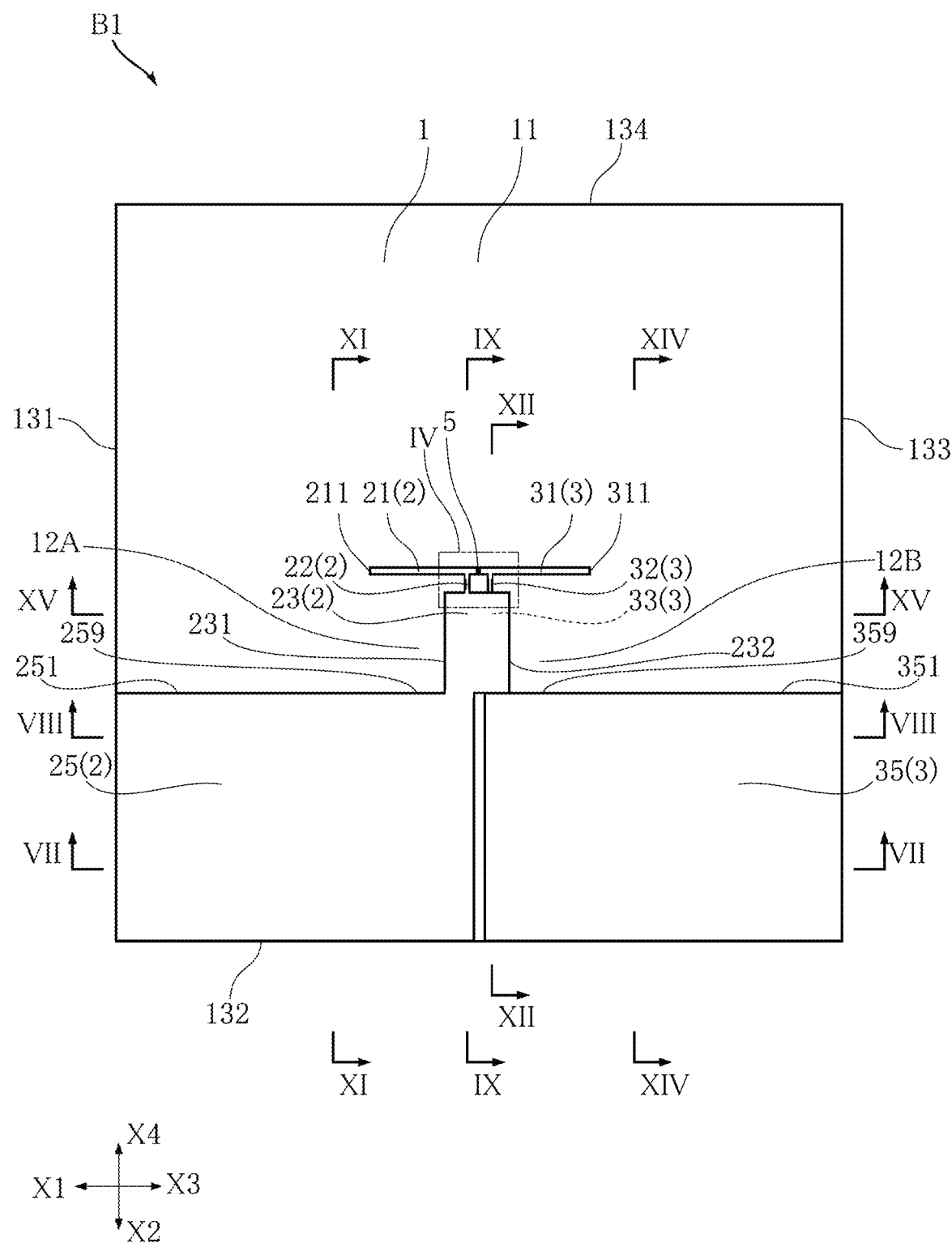
FIG. 2 is a plan view of a terahertz element of the first embodiment.

FIG. 2 is a plan view of the terahertz element of the first embodiment.

The terahertz element B1 shown in the figure is an element configured to radiate high-frequency electromagnetic waves with frequencies in the terahertz band. The terahertz element B1 includes a semiconductor substrate 1, a first electrically conductive layer 2, a second electrically conductive layer 3, an insulating layer 4 (shown in FIG. 7), and an active element 5.

The semiconductor substrate 1 is made of a semiconductor and is semi-insulating. The semiconductor forming the semiconductor substrate 1 is InP, for example. The semiconductor substrate 1 has a surface 11. The surface 11 faces one side in a thickness direction Z1 of the semiconductor substrate 1.

The semiconductor substrate 1 includes edges 131-134. The edge 131 and the edge 133 are spaced apart from each other in a first direction X1. Both of the edge 131 and the edge 133 extend along a second direction X2. The second direction X2 is perpendicular to the first direction X1. The edge 132 and the 134 are spaced apart from each other in the second direction X2. Both of the edge 132 and the edge 134 extend along the first direction X1. The edge 131 is connected to the edge 132, the edge 132 to the edge 133, the edge 133 to the edge 134, and the edge 134 to the edge 131.

Figure 4:
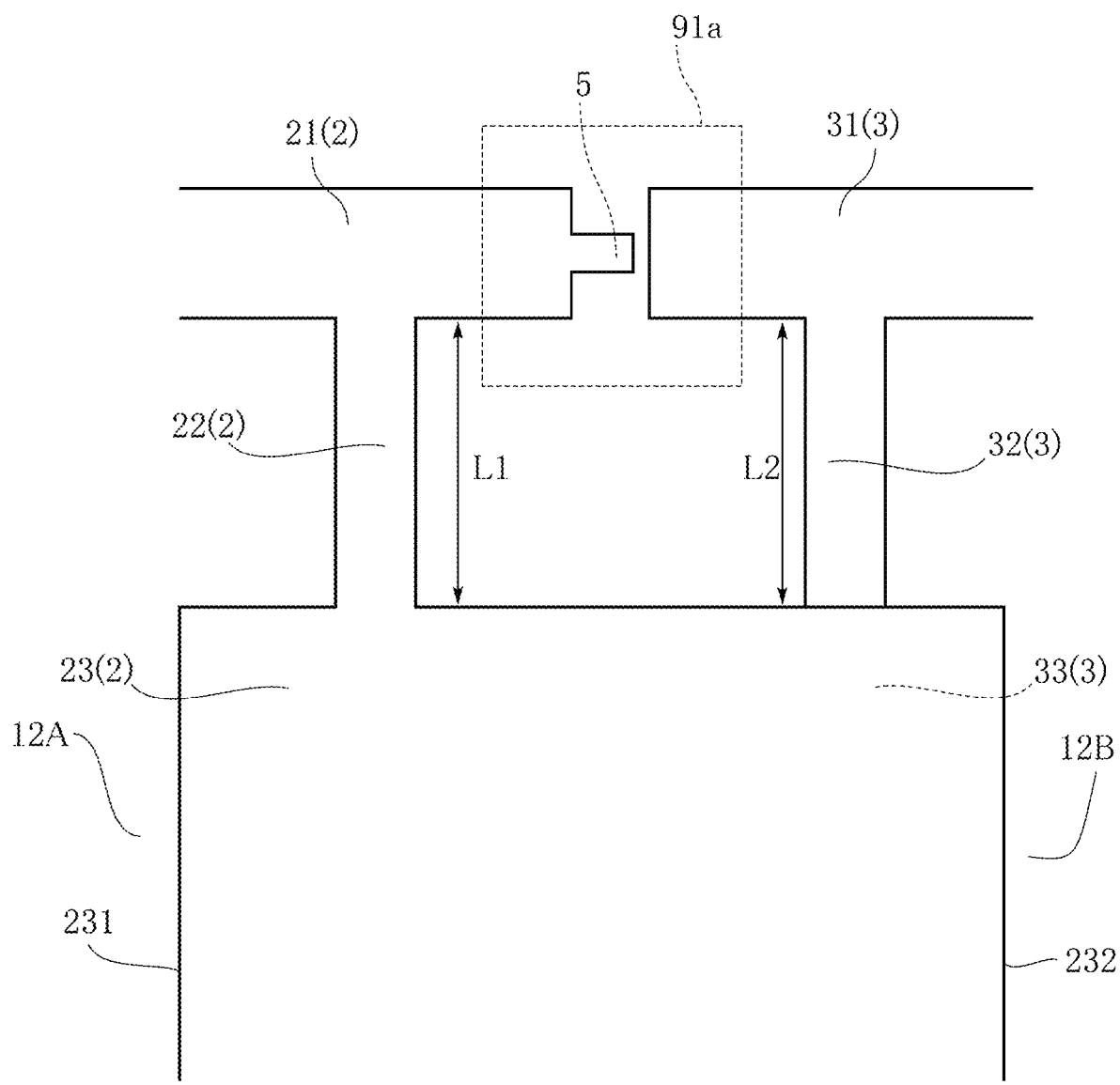
FIG. 4 is a view showing a region IV in FIG. 2 as enlarged.
Figure 9:
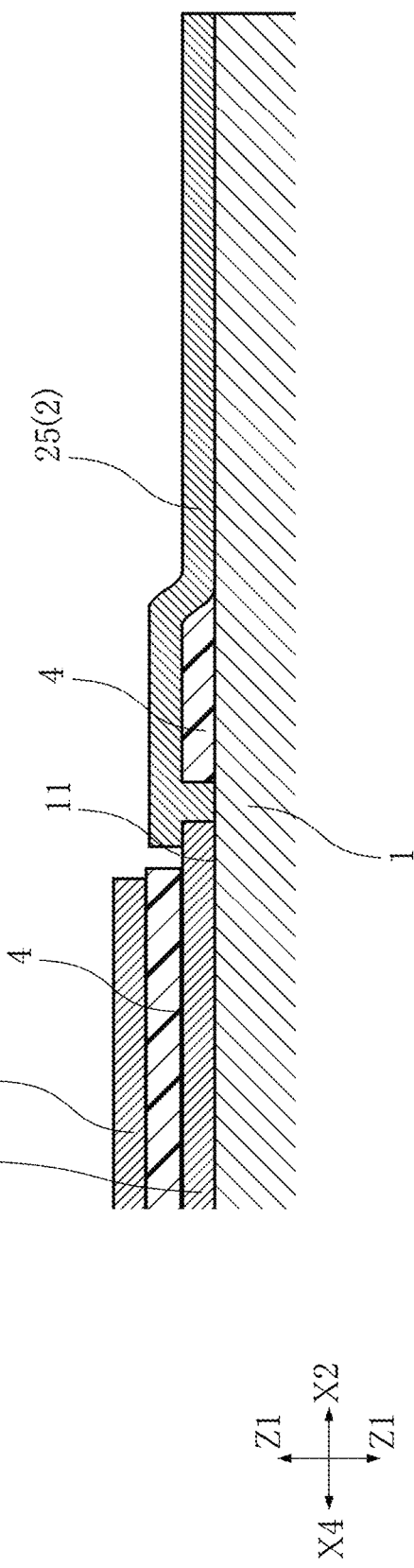
FIG. 9 is a sectional view taken along line IX-IX in FIG. 2.
Figure 10:
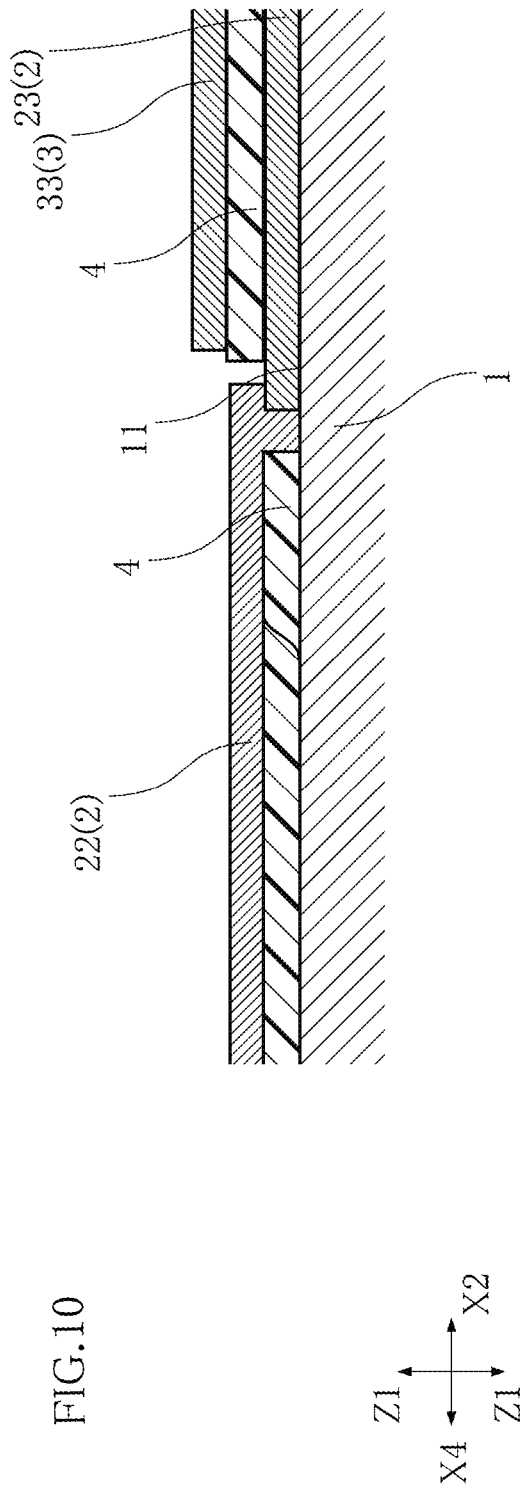
FIG. 10 is a sectional view taken along line IX-IX in FIG. 2.
Figure 13:
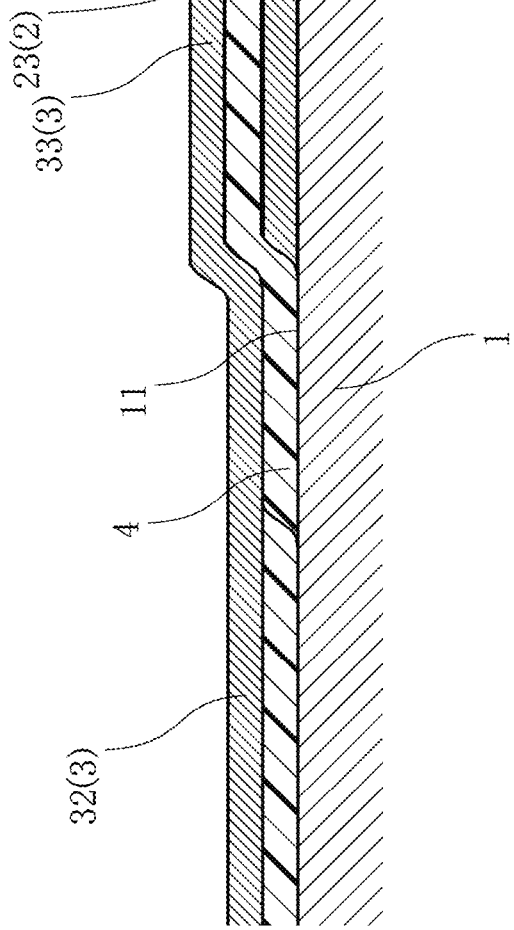
FIG. 13 is a sectional view taken along line XIII-XIII in FIG. 2.
Figure 14:
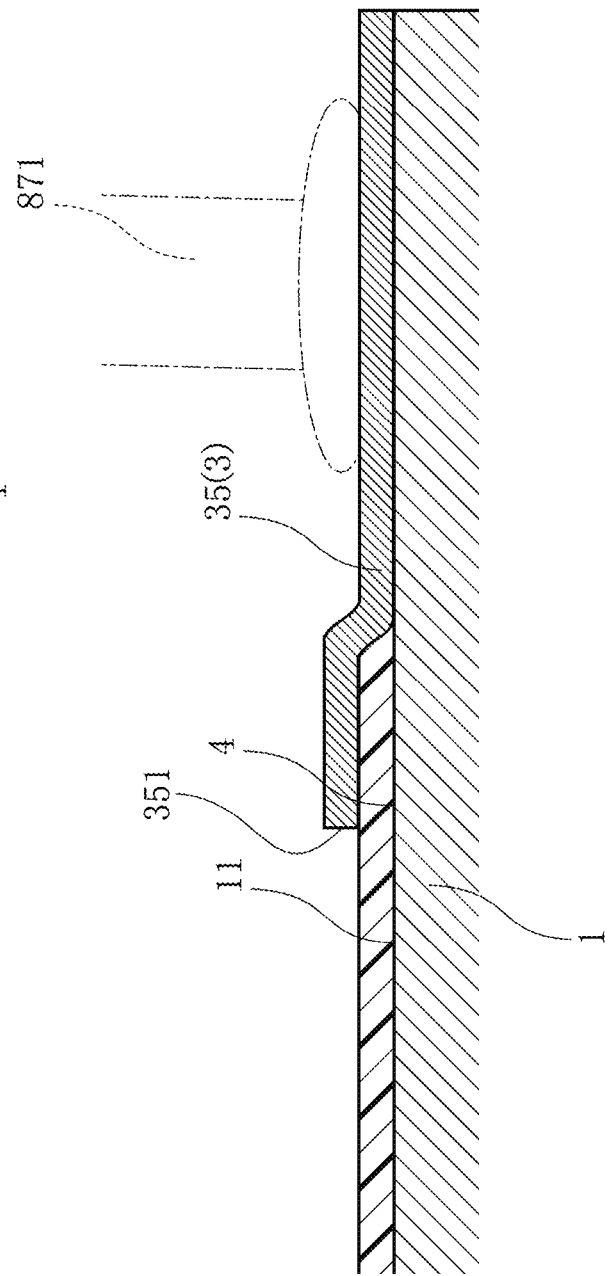
FIG. 14 is a sectional view taken along line XIV-XIV in FIG. 2.

FIG. 4 shows the region IV in FIG. 2 as enlarged. As shown in FIG. 4, the semiconductor substrate 1 is foiled with a semiconductor layer 91a. The semiconductor layer 91a is made of GaInAs, for example.

The active element 5, which is shown in FIGS. 2 and 4, is formed on the semiconductor substrate 1. The active element 5 is electrically connected to the first conductive layer 2 and the second conductive layer 3. The active element 5 is famed on the semiconductor layer 91a. The active element 5 forms a resonator between the second conductive layer 3 and the first conductive layer 2. The electromagnetic waves emitted from the active element 5 are reflected by a back-surface reflective metal layer 88, to have a surface-emission radiation pattern perpendicular to the semiconductor substrate 1 (in the thickness direction Z1).

A typical example of the active element 5 is an RTD. However, the active element 5 may be provided by a diode other than an RTD or a transistor. For example, the active element 5 may be provided by a tunnel transit time (TUN-NETT) diode, an impact ionization avalanche transit time (IMPATT) diode, a GaAs-based field effect transistor (FET), a GaN-based FET, a high electron mobility transistor (HEMT), and a heterojunction bipolar transistor (HBT).

One implementation of the active element 5 is described below with reference to FIGS. 5 and 6. As shown in these figures, the semiconductor layer 91a is disposed on the semiconductor substrate 1. The semiconductor layer 91a may be made of GaInAs as described above and doped with an n-type impurity at a high concentration. A GaInAs layer 92a is disposed on the GaInAs layer 91a and doped with an n-type impurity. A GaInAs layer 93a is disposed on the GaInAs layer 92a and is not doped with any impurity. An AlAs layer 94a is disposed on the GaInAs layer 93a, an InGaAs layer 95 on the AlAs layer 94a, and an GaInAs layer 94b on the InGaAs layer 95. The AlAs layer 94a, the InGaAs layer 95 and the AlAs layer 94b provide an RTD part. A GaInAs layer 93b is disposed on the AlAs layer 94b and is not doped with any impurity. A GaInAs layer 92b is disposed on the GaInAs layer 93b and doped with an n-type impurity. A GaInAs layer 91b is disposed on the GaInAs layer 92b and is doped with an n-type impurity at a high concentration. The first conductive layer 2 is disposed on the GaInAs layer 91b. The second conductive layer 3 is disposed on the GaInAs layer 91a.

Though not illustrated, unlike the configuration shown in FIG. 6, a GaInAs layer doped with an n-type impurity at a high concentration may be interposed between the GaInAs layer 91b and the first conductive layer 2. Such a configuration enhances the contact between the first conductive layer 2 and the GaInAs layer 91b.

An insulating film such as a $SiO_2$ film, a $Si_3N_4$ film, a SiON film, an $HfO_2$ film, an $Al_2O_3$ film or a multi-layered film made up of these, for example, may be deposited on a side wall of the lamination structure shown in FIG. 6.

As shown in FIG. 2, for example, each of the first conductive layer 2 and the second conductive layer 3 is famed on the semiconductor substrate 1. The first conductive layer 2 and the second conductive layer 3 are insulated from each other. Each of the first conductive layer 2 and the second conductive layer 3 has a metal-laminated structure. For example, each of the first conductive layer 2 and the second conductive layer 3 may be provided by laminating Au, Pd and Ti. Alternatively, each of the first conductive layer 2 and the second conductive layer 3 may be provided by laminating Au and Ti. Each of the first conductive layer 2 and the second conductive layer 3 may be approximately 20 to 2000 nm in thickness. Each of the first conductive layer 2 and the second conductive layer 3 may be famed by vacuum vapor deposition or sputtering, for example.

The first conductive layer 2 includes a first antenna part 21, a first inductance part 22, a first capacitor part 23 and a first conductive part 25. The second conductive layer 3 includes a second antenna part 31, a second inductance part 32, a second capacitor part 33 and a second conductive part 35.

The first antenna part 21 extends along the first direction X1. The first inductance part 22 is connected to the first antenna part 21 and the first capacitor part 23 and extends from the first antenna part 21 to the first capacitor part 23 along the second direction X2. The first inductance part 22 functions as an inductance. The length L1 (see FIG. 4) of the first inductance part 22 in the second direction X2 is 5 μm to 100 μm, for example. The width of the first inductance part 22 is 1 μm to 10 μm, for example. As shown in FIG. 4, as viewed in the thickness direction Z1, the first inductance part 22 is spaced apart from the semiconductor layer 91a.

The second antenna part 31 extends along the third direction X3. The third direction X3 is the direction opposite to the first direction X1. The second inductance part 32 is connected to the second antenna part 31 and the second capacitor part 33 and extends from the second antenna part 31 to the second capacitor part 33 along the second direction X2. The second inductance part 32 functions as an inductance. The length L2 (see FIG. 4) of the second inductance part 32 in the second direction X2 is 5 μm to 100 μm, for example. The width of the second inductance part 32 is 1 μm to 10 μm, for example.

The length L1 of the first inductance part 22 in the second direction X2 and the length L2 of the second inductance part 32 in the second direction X2 may influence the oscillation frequency of the terahertz waves. In the present embodiment, the oscillation frequency of the terahertz waves is 300 GHz. To realize the oscillation frequency of 300 GHz, the length L1 of the first inductance part 22 in the second direction X2 and the length L2 of the second inductance part 32 in the second direction X2 are set to 10 μm. As shown in FIG. 4, as viewed in the thickness direction Z1, the second inductance part 32 is spaced apart from the semiconductor layer 91a.

As shown in e.g. FIGS. 2 and 4, the first capacitor part 23 is positioned offset from the active element 5 in the second direction X2. In the present embodiment, the first capacitor part 23 is rectangular as viewed in the thickness direction Z1. The first capacitor part 23 has a first capacitor-part side surface 231 and a second capacitor-part side surface 232. The first capacitor-part side surface 231 is the side of the first capacitor part 23 in the first direction X1. The first capacitor-part side surface 231 extends along the second direction X2. The first capacitor-part side surface 231 is offset in the third direction X3, which is opposite to the first direction X1, from the end 211 of the first antenna part 21 in the first direction X1. The second capacitor-part side surface 232 is the side of the first capacitor part 23 in the third direction X3. The second capacitor-part side surface 232 extends along the second direction X2. The second capacitor-part side surface 232 is offset in the first direction X1 from the end 311 of the second antenna part 31 in the third direction X3.

Figure 3:
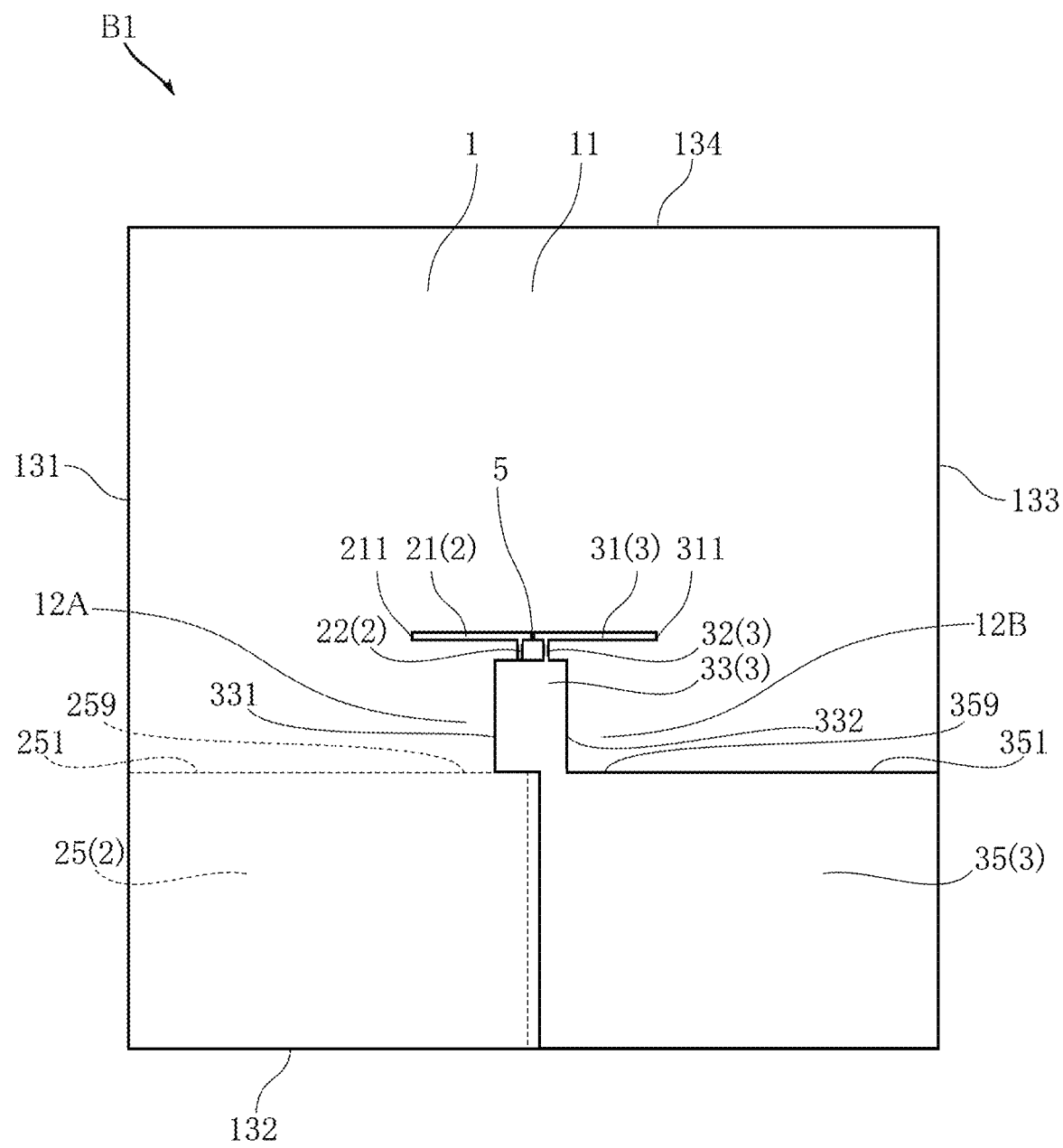
FIG. 3 is a view obtained by omitting a first conductive part and a first capacitor part from FIG. 2.

FIG. 3 is a view obtained by omitting the first conductive part 25 and the first capacitor part 23 from FIG. 2.

Figure 15:
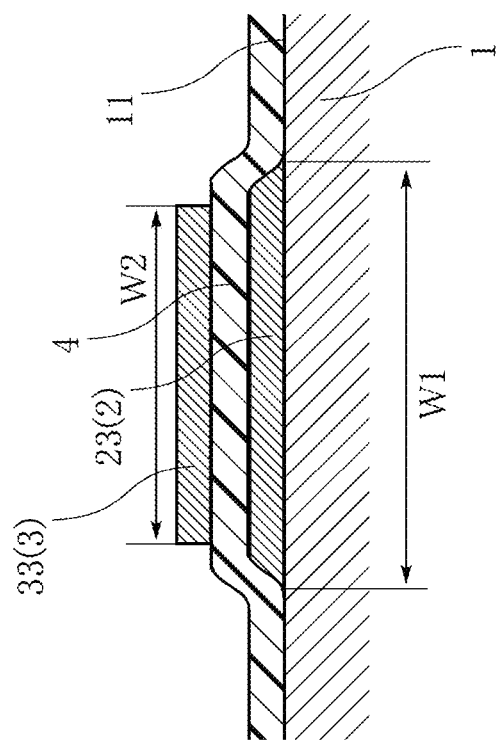
FIG. 15 is a sectional view taken along line XV-XV in FIG. 2.

The second capacitor part 33 is positioned offset from the active element 5 in the second direction X2. As shown in FIG. 15, the first capacitor part 23 is interposed between the second capacitor part 33 and the semiconductor substrate 1. Unlike the present embodiment, the second capacitor part 33 may be interposed between the first capacitor part 23 and the semiconductor substrate 1. The second capacitor part 33 is stacked over the first capacitor part 23 and insulated from the first capacitor part 23 by the insulating layer 4. The second capacitor part 33 and the first capacitor part 23 provide a capacitor. In the present embodiment, the second capacitor part 33 is rectangular as viewed in the thickness direction Z1. In the present embodiment, as shown in FIG. 15, the dimension W2 of the second capacitor part 33 in the first direction X1 differs from the dimension W1 of the first capacitor part 23 in the first direction X1. In the present embodiment, the dimension W2 of the second capacitor part 33 in the first direction X1 is larger than the dimension W1 of the first capacitor part 23 in the first direction X1. This allows the second capacitor part 33 to be reliably famed above the first capacitor part 23 even when the formation position of the second capacitor part 33 is deviated due to a manufacturing error. Unlike the present embodiment, the dimension W2 of the second capacitor part 33 in the first direction X1 may be smaller than the dimension W1 of the first capacitor part 23 in the first direction X1.

As shown in FIG. 3, the second capacitor part 33 has a first capacitor-part side surface 331 and a second capacitor-part side surface 332. The first capacitor-part side surface 331 is the side of the second capacitor part 33 in the first direction X1. The first capacitor-part side surface 331 extends along the second direction X2. The first capacitor-part side surface 331 is offset in the third direction X3, which is opposite to the first direction X1, from the end 211 of the first antenna part 21 in the first direction X1. The second capacitor-part side surface 332 is the side of the second capacitor part 33 in the third direction X3. The second capacitor-part side surface 332 extends along the second direction X2. The second capacitor-part side surface 332 is offset in the first direction X1 from the end 311 of the second antenna part 31 in the third direction X3.

As shown in FIG. 2, the semiconductor substrate 1 includes an exposed part 12A and an exposed part 12B. The exposed part 12A and the exposed part 12B are the portions that are exposed from the first capacitor part 23 and the second capacitor part 33. The exposed part 12A is positioned offset from the first capacitor part 23 and the second capacitor part 33 in the first direction X1. The exposed part 12B is positioned offset from the first capacitor part 23 and the second capacitor part 33 in the third direction X3.

The first conductive part 25 is connected to the first capacitor part 23. In the present embodiment, the first conductive part 25 is rectangular. In the present embodiment, the first conductive part 25 is a pad portion to which the wire 871 (see FIG. 1) is bonded. As shown in FIG. 11, the first conductive part 25 has a portion that is held in direct contact with the semiconductor substrate 1. As viewed in the thickness direction Z1, this contacting portion overlaps with a wire-bonding part where the wire 871 and the first conductive part 25 are in contact with each other. As shown in FIG. 2, the first conductive part 25 has a portion 259 that is spaced apart from the first antenna part 21 in the second direction X2 with the exposed part 12A between them, as viewed in the thickness direction Z1. The first conductive part 25 includes a first conductive-part side surface 251. The first conductive-part side surface 251 is spaced apart from the first antenna part 21 in the second direction X2 with the exposed part 12A between them, as viewed in the thickness direction Z1. In the present embodiment, the first conductive-part side surface 251 extends along the first direction X1. Unlike the present embodiment, the first conductive-part side surface 251 may be curved.

Figure 17:
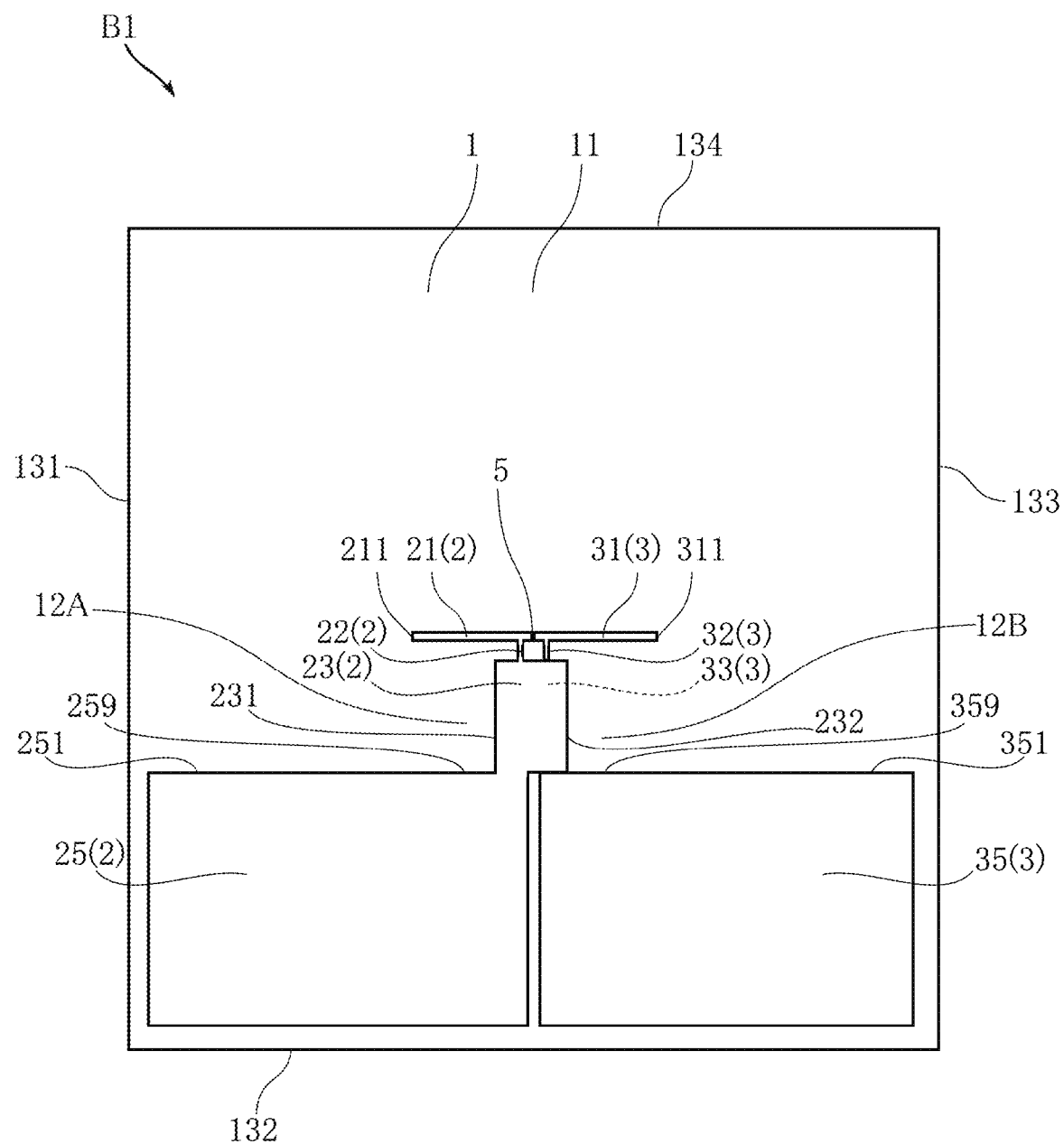
FIG. 17 is a plan view showing a variation of the terahertz element.

In the present embodiment, as shown in FIG. 2, the first conductive part 25 reaches the edge 131 and the edge 132, as viewed in the thickness direction Z1. As shown in FIG. 17, the first conductive part 25 may not reach the edge 131 and the edge 132 as viewed in the thickness direction Z1. Such an arrangement reduces formation of burrs in the process of manufacturing the terahertz element B1, which may occur by cutting the first conductive part 25 in dicing the semiconductor substrate 1.

The second conductive part 35 is connected to the second capacitor part 33. In the present embodiment, the second conductive part 35 is rectangular. In the present embodiment, the second conductive part 35 is a pad portion to which the wire 872 is bonded. As shown in FIG. 12, the second conductive part 35 has a portion that is held in direct contact with the semiconductor substrate 1. As viewed in the thickness direction Z1, this contacting portion overlaps with a wire-bonding part where the wire 872 and the second conductive part 35 are in contact with each other. As shown in FIG. 2, the second conductive part 35 has a portion 359 that is spaced apart from the second antenna part 31 in the second direction X2 with the exposed part 12B between them, as viewed in the thickness direction Z1. The second conductive part 35 includes a second conductive-part side surface 351. The second conductive-part side surface 351 is spaced apart from the second antenna part 31 in the second direction X2 with the exposed part 12B between them, as viewed in the thickness direction Z1. In the present embodiment, the second conductive-part side surface 351 extends along the first direction X1. Unlike the present embodiment, the second conductive-part side surface 351 may be curved.

In the present embodiment, as shown in FIG. 2, the second conductive part 35 reaches the edge 133 and the edge 132, as viewed in the thickness direction Z1. As shown in FIG. 17, the second conductive part 35 may not reach the edge 133 and the edge 132 as viewed in the thickness direction Z1. Such an arrangement reduces formation of burrs in the process of manufacturing the terahertz element B1, which may occur by cutting the second conductive part 35 in dicing the semiconductor substrate 1.

The insulating layer 4, which is shown in FIGS. 8-15, is made of $SiO_2$, for example. Alternatively, the material forming the insulating layer 4 may be $Si_3N_4$, SiON, $HfO_2$ or $Al_2O_3$. The insulating layer 4 may be approximately 10 nm to 1000 nm in thickness. The insulating layer 4 may be famed by CVD or sputtering, for example. The insulating layer 4 is interposed between the first conductive layer 2 (e.g. the first antenna part 21, the first inductance part 22 and the first conductive part 25) and the semiconductor substrate 1 and between the second conductive layer 3 (the second antenna part 31, the second inductance part 32 and the second conductive part 35) and the semiconductor substrate 1. As described above, a part of the insulating layer 4 is interposed between the first capacitor part 23 and the second capacitor part 33.

Figure 16:
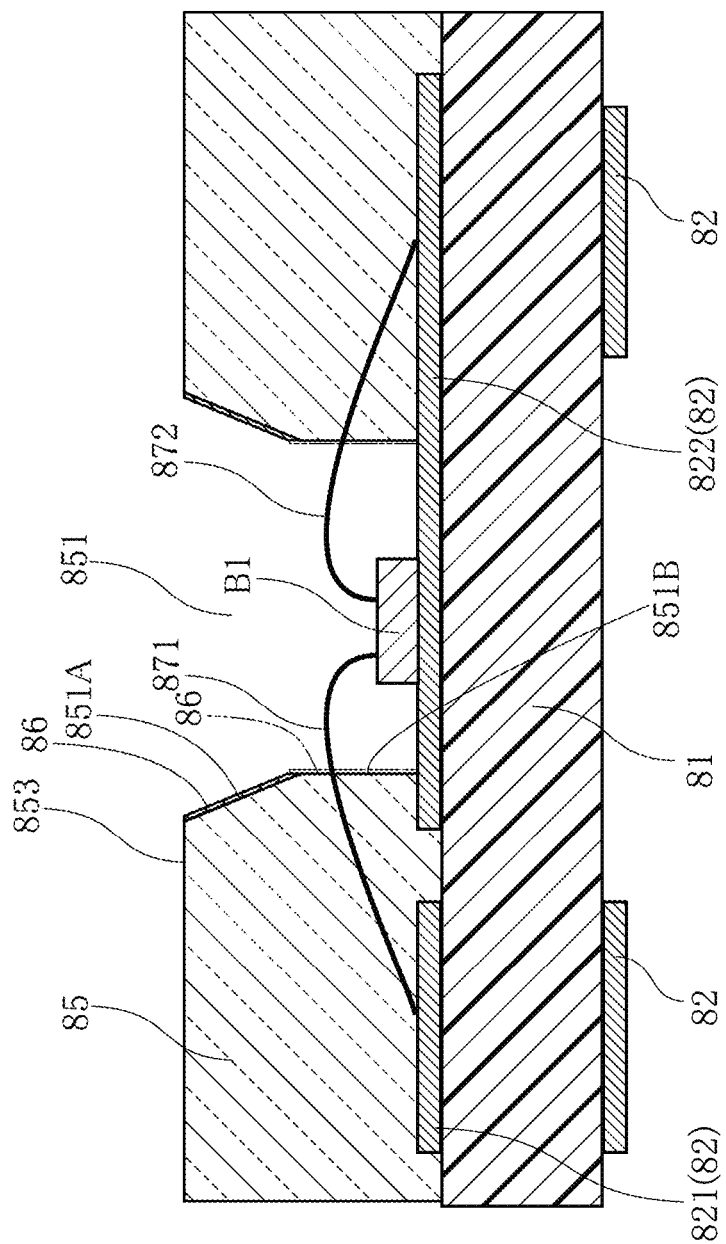
FIG. 16 is a sectional view of the semiconductor device of FIG. 1.

FIG. 16 is a sectional view of the semiconductor device A1 of FIG. 1.

The wiring board 81 shown in FIG. 16 is a glass epoxy board, for example. The terahertz element B1 is disposed on the wiring board 81. The wiring board 81 is famed with a wiring pattern 82. The wiring pattern 82 includes a first portion 821 and a second portion 822. The first portion 821 and the second portion 822 are spaced apart from each other.

The insulating part 85 is disposed on the wiring board 81. The insulating part 85 may be made of resin (e.g. epoxy resin). The insulating part 85 has a surface 853. The surface 853 faces one side in the thickness direction of the wiring board 81 (which corresponds to the thickness direction Z1 of the semiconductor substrate 1 in the present embodiment). The insulating part 85 is famed with an opening 851 in which the terahertz element B1 is housed. The opening 851 has a first side surface 851A and a second side surface 851B. The first side surface 851A is inclined with respect to the thickness direction Z1 of the wiring board 81. The second side surface 851B is positioned between the first side surface 851A and the wiring board 81 in the thickness direction Z1 of the wiring board 81. The second side surface 851B extends along the thickness direction Z1 of the wiring board 81. The dimension of the second side surface 851B in the thickness direction Z1 of the wiring board 81 is larger than the dimension of the terahertz element B1 in the thickness direction Z1 of the wiring board 81.

As shown in FIG. 16, a metal layer 86 may be foiled on the first side surface 851A. As shown in the figure, the metal layer 86 may be famed on the second side surface 851B as well. The metal layer 86 may be famed by metal plating. The metal layer 86 efficiently reflects terahertz waves. The wires 871 and 872 are bonded to the terahertz element B1 and the wiring board 81 (more specifically, the wiring pattern 82). The wire 871 is bonded to the first conductive part 25 of the terahertz element B1 and the first portion 821 of the wiring pattern 82. The wire 872 is bonded to the second conductive part 35 of the terahertz element B1 and the second portion 822 of the wiring pattern 82. The first side surface 851A and the second side surface 851B may be made of metal.

In the present embodiment, as shown in FIG. 2, the semiconductor substrate 1 includes the exposed part 12A exposed from the first capacitor part 23 and the second capacitor part 33. The first conductive part 25 has the portion 259 that is spaced apart from the first antenna part 21 in the second direction X2 with the exposed part 12A between them, as viewed in the thickness direction Z1. Such an arrangement reduces the area of the first conductive layer 2 that is close to the active element 5. This reduces the possibility that the first conductive layer 2 (the first conductive part 25, in particular) adversely affects the polarization characteristics of the terahertz waves emitted from the active element 5.

In the present embodiment, as shown in FIG. 11, the first conductive part 25 has a portion that is held in direct contact with the semiconductor substrate 1. Such an arrangement allows for bonding a wire to a relatively hard portion of the first conductive part 25. This prevents detachment of the wire from the first conductive part 25. The second conductive part 35 shown in FIG. 12 has the same advantage.

In the present embodiment, the opening 851 of the insulating part 85 has the first side surface 851A, as shown in FIG. 16. The first side surface 851A is inclined with respect to the thickness direction Z1 of the wiring board 81. With such an arrangement, even when terahertz waves emitted from the terahertz element B1 are reflected back by a terahertz wave detection device and reflected on the first side surface 851A, such reflected waves can be prevented from traveling toward the detection device. This reduces interference due to the reflection of terahertz waves. At the same time, the antenna efficiency is improved.

In the present embodiment, as shown in FIG. 16, the second side surface 851B extends along the thickness direction Z1 of the wiring board 81. With such an arrangement, terahertz waves can be reflected on the second side surface 851B a plurality of times so as to travel in the thickness direction Z1. Thus, the terahertz waves are efficiently directed upward in FIG. 16.

In the present embodiment, the dimension of the second side surface 851B in the thickness direction Z1 of the wiring board 81 is larger than the dimension of the terahertz element B1 in the thickness direction Z1 of the wiring board 81. With such an arrangement, the terahertz waves are more efficiently directed upward in FIG. 16.

Second Embodiment

A second embodiment of the present disclosure is described below with reference to FIG. 18.

In the following descriptions, the structures that are identical or similar to the above are denoted by the same reference signs as above, and descriptions thereof are omitted appropriately.

Figure 18:
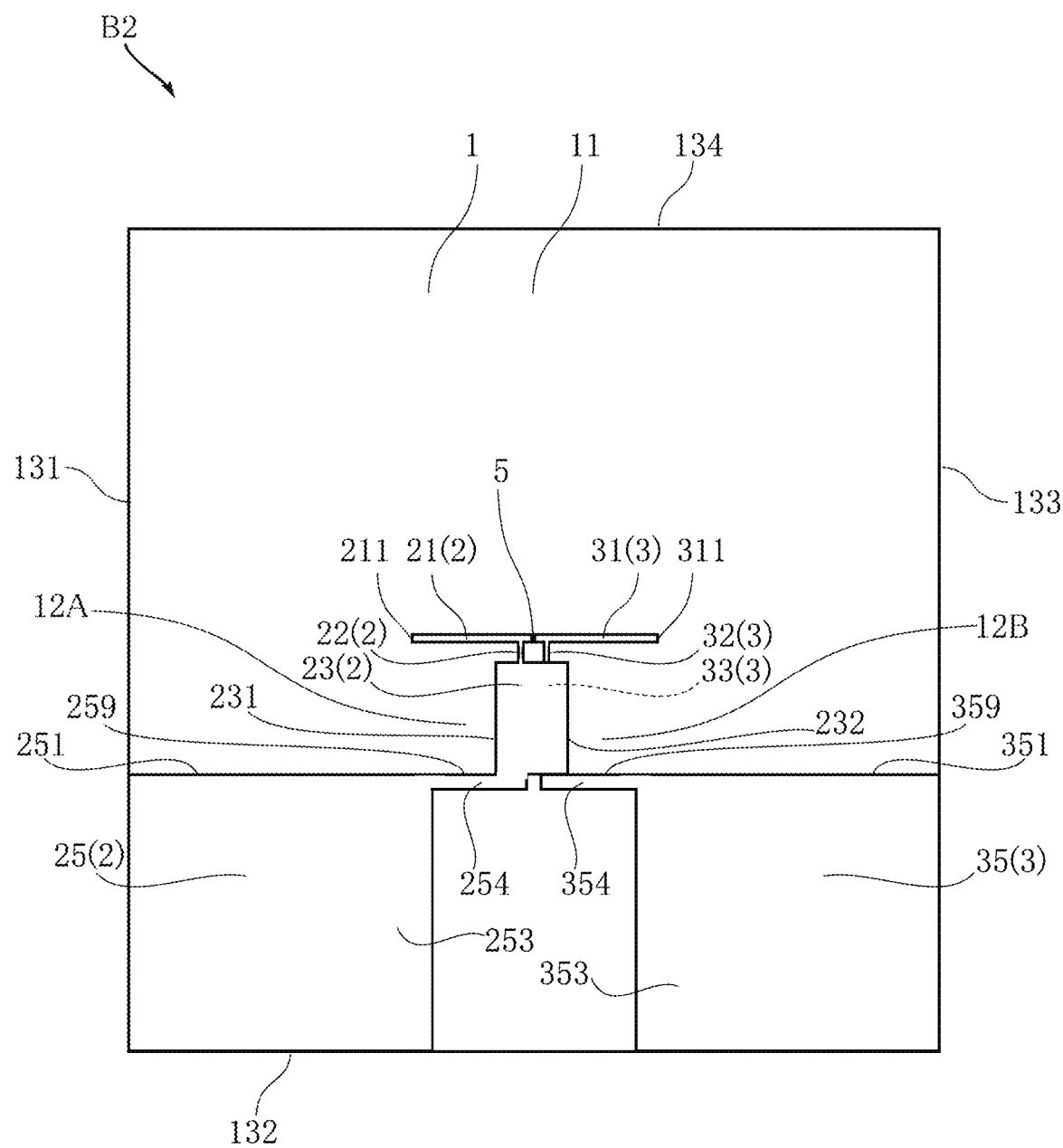
FIG. 18 is a plan view of a terahertz element of a second embodiment.

In the terahertz element B2 shown in FIG. 18, the first conductive part 25 includes a first conductive section 253 and a first extension 254 extending out of the first conductive section 253. The first extension 254 is connected to the first capacitor part 23. The second conductive part 35 includes a second conductive section 353 and a second extension 354 extending out of the second conductive section 353. The second extension 354 is connected to the second capacitor part 33. Since other points of the terahertz element B2 are generally the same as those described above as to the terahertz element B1, the description is omitted. The present embodiment provides the same advantages as those described above as to the first embodiment.

Third Embodiment

A third embodiment of the present disclosure is described below with reference to FIG. 19.

Figure 19:
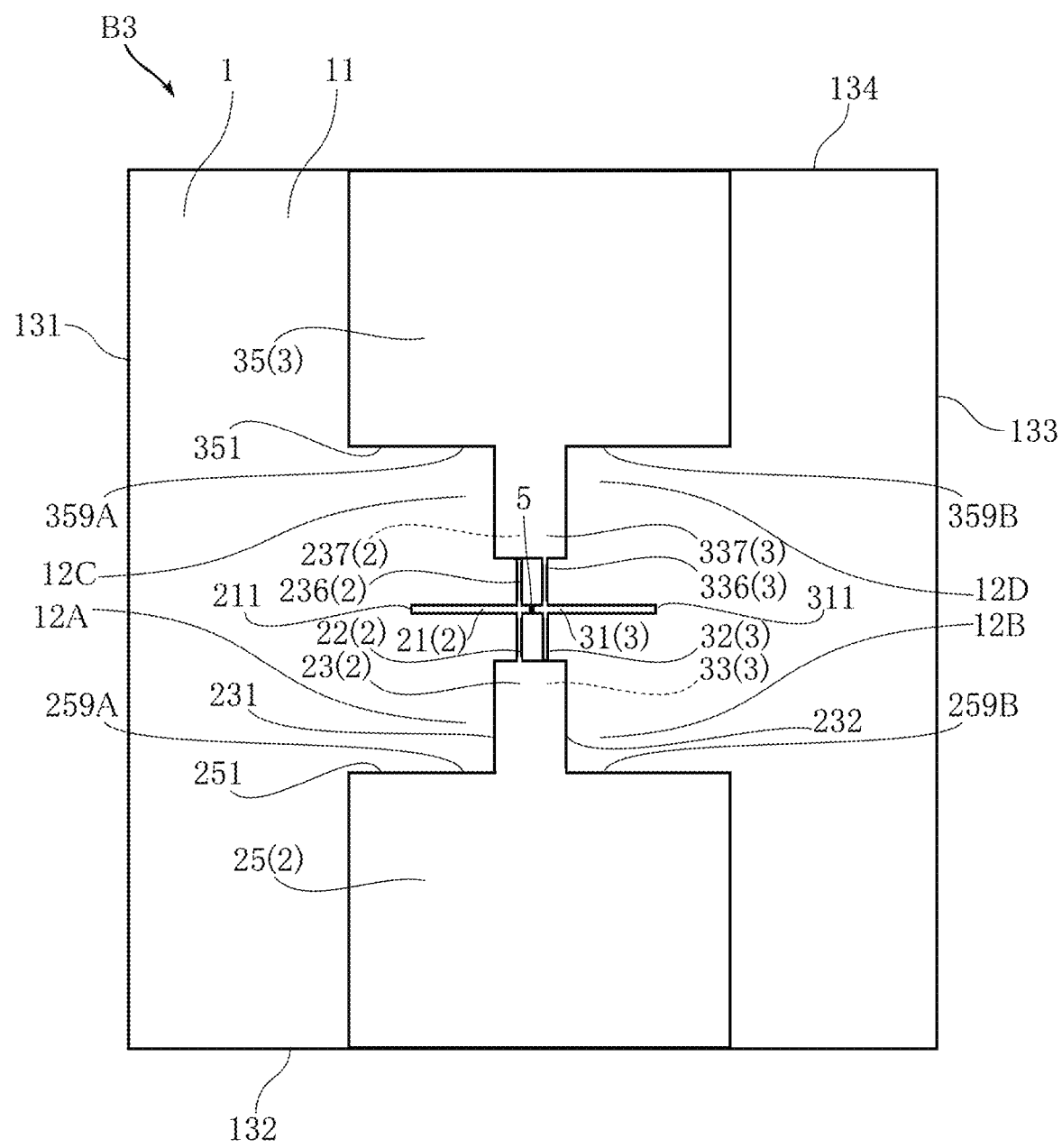
FIG. 19 is a plan view of a terahertz element of a third embodiment.

The terahertz element B3 shown in FIG. 19 differs from the terahertz element B1 in shape of the first conductive layer 2 and the second conductive layer 3. In the terahertz element B3, the second conductive layer 3 includes a second conductive part 35 disposed opposite to the first conductive part 25 with the active element 5 between them.

The first conductive layer 2 includes a third inductance part 236 and a third capacitor part 237, in addition to the first antenna part 21, the first inductance part 22, the first capacitor part 23 and the first conductive part 25. The second conductive layer 3 includes a fourth inductance part 336 and a fourth capacitor part 337, in addition to the second antenna part 31, the second inductance part 32, the second capacitor part 33 and the second conductive part 35.

The first antenna part 21 extends along the first direction X1. The first inductance part 22 is connected to the first antenna part 21 and the first capacitor part 23 and extends from the first antenna part 21 to the first capacitor part 23 along the second direction X2. The third inductance part 236 is connected to the first antenna part 21 and the third capacitor part 237 and extends from the third capacitor part 237 to the first antenna part 21 along the second direction X2. The first inductance part 22 and the third inductance part 236 function as an inductance.

The length of each of the first inductance part 22 and the third inductance part 236 in the second direction X2 is 10 μm to 200 μm, for example. The width of each of the first inductance part 22 and the third inductance part 236 is 1 μm to 10 μm, for example. To obtain the same oscillation frequency as the terahertz element B1 of the first embodiment, the length in the second direction X2 of each of the first inductance part 22 and the third inductance part 236 of the present embodiment may be set to twice the length in the second direction X2 of the first inductance part 22 of the first embodiment.

The second antenna part 31 extends along the third direction X3. The second inductance part 32 is connected to the second antenna part 31 and the second capacitor part 33 and extends from the second antenna part 31 to the second capacitor part 33 along the second direction X2. The fourth inductance part 336 is connected to the second antenna part 31 and the fourth capacitor part 337 and extends from the fourth capacitor part 337 to the second antenna part 31 along the second direction X2. The second inductance part 32 and the fourth inductance part 336 function as an inductance.

The length of each of the second inductance part 32 and the fourth inductance part 336 in the second direction X2 is 10 μm to 200 μm, for example. The width of each of the second inductance part 32 and the fourth inductance part 336 is 1 μm to 10 μm, for example. To obtain the same oscillation frequency as the terahertz element B1 of the first embodiment, the length in the second direction X2 of each of the second inductance part 32 and the fourth inductance part 336 of the present embodiment may be set to twice the length in the second direction X2 of the second inductance part 32 of the first embodiment.

The first capacitor part 23 and the second capacitor part 33 are not described herein, because the description given above as to the first embodiment is applicable.

The semiconductor substrate 1 includes an exposed part 12A, an exposed part 12B, an exposed part 12C and an exposed part 12D. Since the exposed part 12A and the exposed part 12B are as described above in the first embodiment, description in the present embodiment is omitted. The exposed part 12C and the exposed part 12D are the portions exposed from the third capacitor part 237 and the fourth capacitor part 337. The exposed part 12C is positioned offset from the third capacitor part 237 and the fourth capacitor part 337 in the first direction X1. The exposed part 12D is positioned offset from the third capacitor part 237 and the fourth capacitor part 337 in the third direction X3.

The first conductive part 25 is connected to the first capacitor part 23. The entirety of the first capacitor part 23 overlaps with the first conductive part 25 in the first direction X1. In the present embodiment, the first conductive part 25 is rectangular. In the present embodiment, the first conductive part 25 is a conductive portion to which a wire is bonded. The first conductive part 25 has a portion 259A that is spaced apart from the first antenna part 21 in the second direction X2 with the exposed part 12A between them, as viewed in the thickness direction Z1. The first conductive part 25 has a portion 259B that is spaced apart from the second antenna part 31 in the second direction X2 with the exposed part 12B between them, as viewed in the thickness direction Z1.

The second conductive part 35 is connected to the fourth capacitor part 337. The entirety of the fourth capacitor part 337 overlaps with the second conductive part 35 in the first direction X1. In the present embodiment, the second conductive part 35 is rectangular. In the present embodiment, the second conductive part 35 is a conductive portion to which a wire is bonded. The second conductive part 35 has a portion 359A that is spaced apart from the first antenna part 21 in the fourth direction X4, which is opposite to the second direction X2, with the exposed part 12C between them, as viewed in the thickness direction Z1. The second conductive part 35 has a portion 359B that is spaced apart from the second antenna part 31 in the fourth direction X4 with the exposed part 12B between them, as viewed in the thickness direction Z1.

The present embodiment provides the same advantages as those described above as to the first embodiment.

Fourth Embodiment

Figure 20:
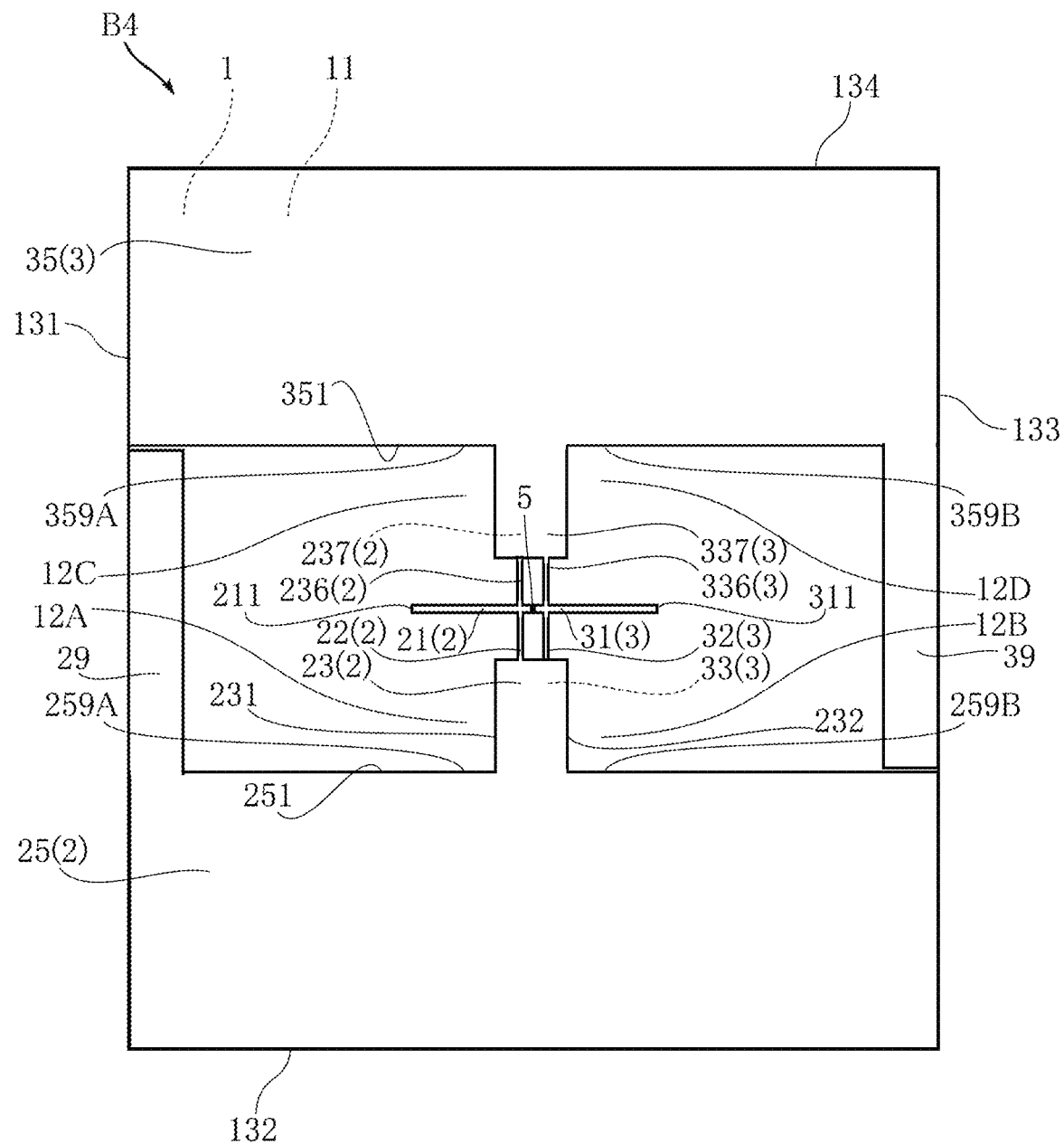
FIG. 20 is a plan view of a terahertz element of a fourth embodiment.

A fourth embodiment of the present disclosure is described below with reference to FIG. 20.

In the terahertz element B4 shown in the figure, the first conductive layer 2 has a portion 29, and the second conductive layer 3 has a portion 39. In the present embodiment, the portion 29 and the portion 39 may be stacked over each other while being insulated from each other. The present embodiment provides the same advantages as those described above as to the first embodiment.

Examples

Examples of the first embodiment of the present disclosure are described below with reference to FIGS. 21-25. The examples of the first embodiment described below are applicable to the embodiments other than the first embodiment (i.e., the second, the third and the fourth embodiments).

Figure 21:
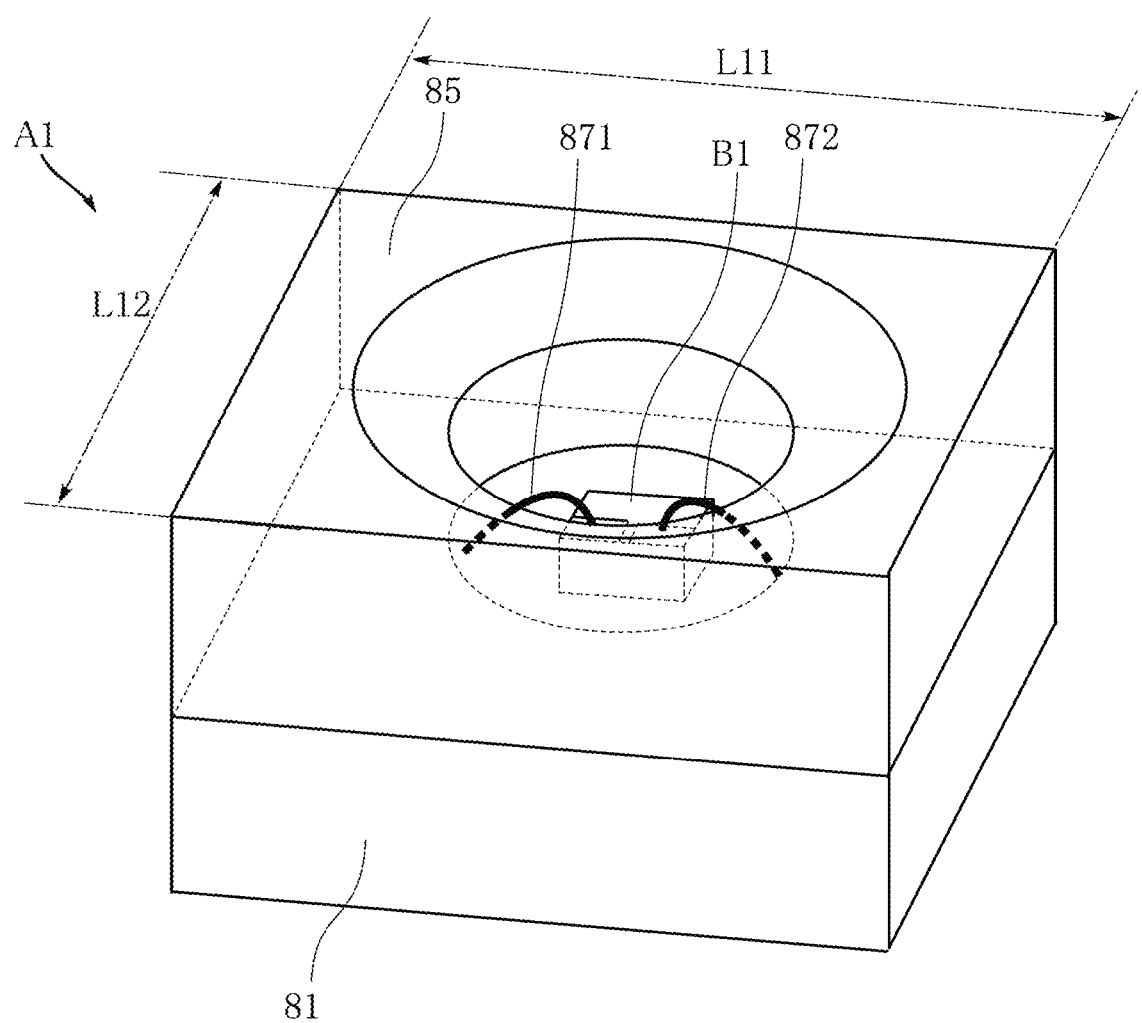
FIG. 21 is a perspective view of a semiconductor device as an example.
Figure 22:
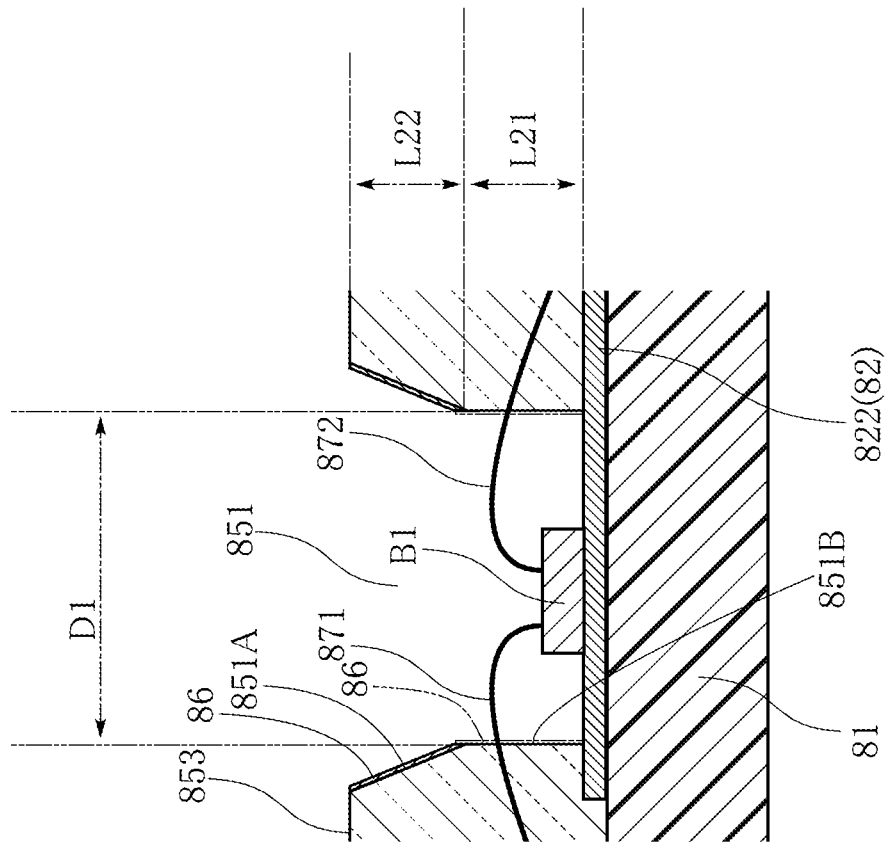
FIG. 22 is a sectional enlarged view showing a part of a semiconductor device as an example.

As shown in FIGS. 21 and 22, the dimension of one side of the semiconductor device A1 as viewed in plan is defined as dimension L11, the dimension of the other side is defined as dimension L12, and the inner diameter of the opening 851 is defined as inner diameter D1. As shown in FIG. 22, the dimension of first side surface 851, of the opening 851 in the direction Z1 is defined as dimension L22, and the dimension of the second side surface 851B of the opening 851 in the direction Z1 is defined as dimension L21. FIG. 21 and FIG. 22 are the views corresponding to FIG. 1 and FIG. 16, respectively, to which indications of dimensions and inner diameters are added.

Figure 23:
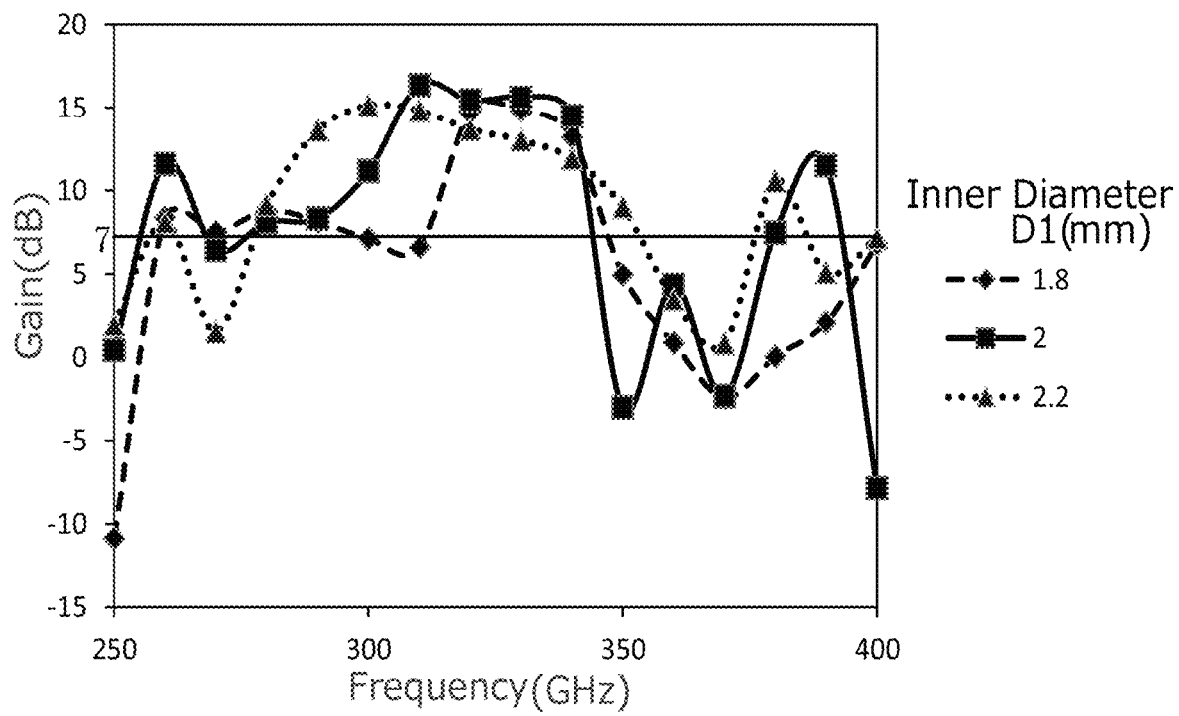
FIG. 23 is a graph showing the antenna gain versus frequencies of terahertz waves for different inner diameters.

FIG. 23 shows the antenna gain (Gain) versus frequencies of terahertz waves from the semiconductor device A1 for different inner diameters D1. FIG. 23 shows the calculation results in the cases where the inner diameter D1 is 1.8 mm, 2.0 mm and 2.2 mm. Note that each of the dimensions L11 and L12 is set to 3.4 mm, the dimension L21 to 0.9 mm, and the dimension L22 to 1.0 mm. The first side surface 851A of the opening 851 is inclined 20 degrees with respect to the direction Z1. It is preferable that the antenna gain of the semiconductor device A1 is not less than 7 dB or 8 dB, for example. In the example shown in FIG. 23, the semiconductor device A1 exhibits the antenna gain of not less than 7 dB, for example, in any of the cases where the inner diameter D1 is 1.8 mm, 2.0 mm and 2.2 mm. For example, preferable results are exhibited when the frequency of the terahertz element is in the range of 300 to 330 GHz. However, frequencies of the terahertz element other than this range may be used. According to FIG. 23, the inner diameter D1 may be set to 1.7 to 1.9 mm, for example, in light of the results in the case where the inner diameter D1 is 1.8 mm. According to FIG. 23, the inner diameter D1 may be set to 1.9 to 2.1 mm, for example, in light of the results in the case where the inner diameter D1 is 2.0 mm. According to FIG. 23, the inner diameter D1 may be set to 2.1 to 2.3 mm, for example, in light of the results in the case where the inner diameter D1 is 2.2 mm. Also, the inner diameter D1 may be set to 1.7 to 2.3 mm.

Figure 24:
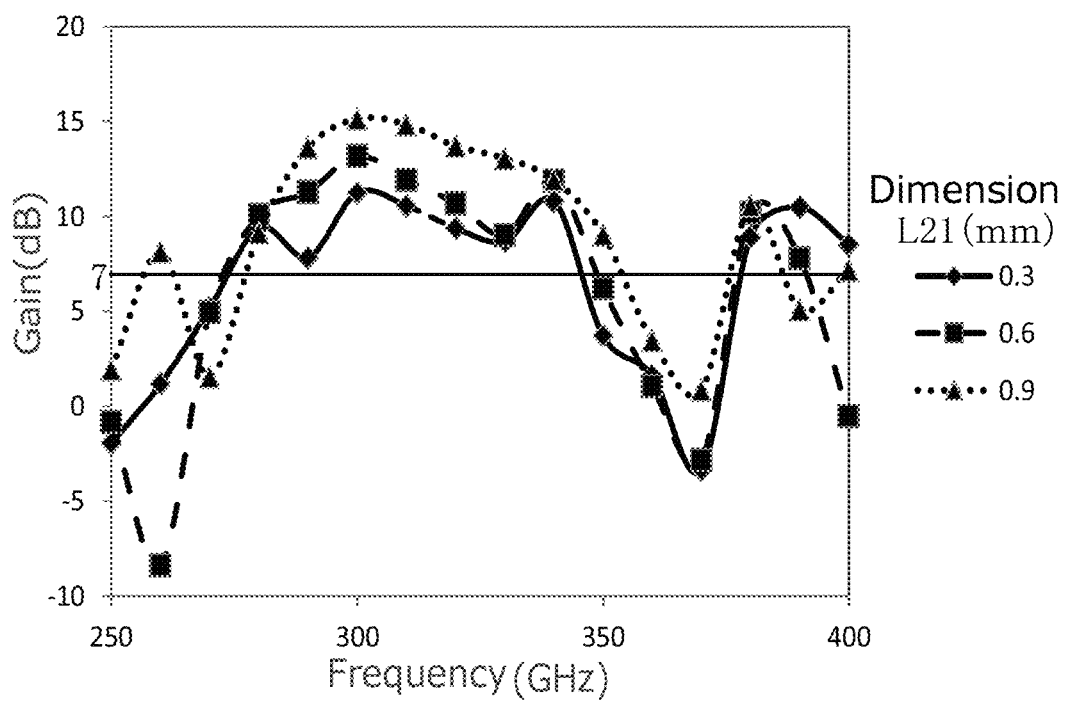
FIG. 24 is a graph showing the antenna gain versus frequencies of terahertz waves for different dimensions.

FIG. 24 shows the antenna gain (Gain) versus frequencies of terahertz waves from the semiconductor device A1 for different dimensions L21. FIG. 24 shows the calculation results in the cases where the dimension L21 is 0.3 mm, 0.6 mm and 0.9 mm. In the example shown in FIG. 24, the dimension L21 is made relatively large to improve the performance of the semiconductor device A1. Note that the dimensions L11 and L12 each are 3.4 mm, the inner diameter D1 is 2.2 mm, and the dimension L22 is 1.0 mm. The first side surface 851, of the opening 851 is inclined 20 degrees with respect to the direction Z1. It is preferable that the antenna gain of the semiconductor device A1 is not less than 7 dB or 8 dB, for example. In the example shown in FIG. 24, the semiconductor device A1 exhibits the antenna gain of not less than 7 dB, for example, in any of the cases where the dimension L21 is 0.3 mm, 0.6 mm and 0.9 mm. For example, preferable results are exhibited when the frequency of the terahertz element is in the range of 300 to 330 GHz. However, frequencies of the terahertz element other than this range may be used. According to FIG. 24, the dimension L21 may be set to 0.2 to 0.4 mm, for example, in light of the results in the case where the dimension L21 is 0.3 mm. According to FIG. 24, the dimension L21 may be set to 0.5 to 0.7 mm, for example, in light of the results in the case where the dimension L21 is 0.6 mm. According to FIG. 24, the dimension L21 may be set to 0.8 to 1.0 mm, for example, in light of the results in the case where the dimension L21 is 0.9 mm. Also, the dimension L21 may be set to 0.2 to 1.0 mm.

Figure 25:
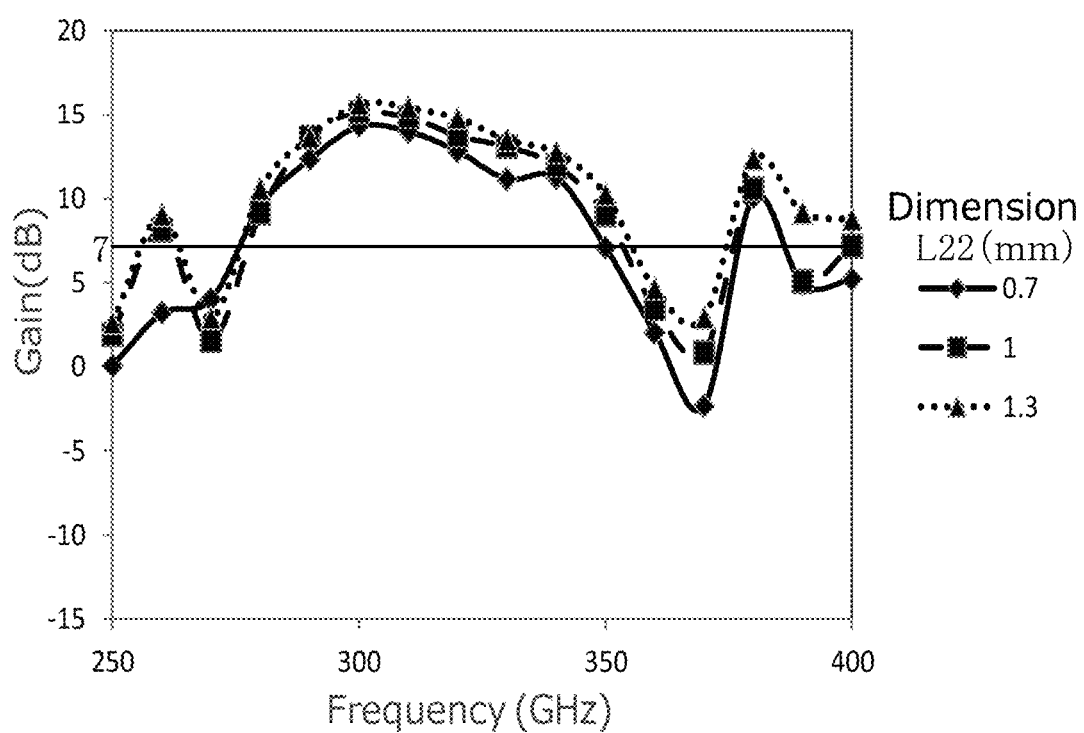
FIG. 25 is a graph showing the antenna gain versus frequencies of terahertz waves for different dimensions.

FIG. 25 shows the antenna gain (Gain) versus frequencies of terahertz waves from the semiconductor device A1 for different dimensions L22. FIG. 25 shows the calculation results in the cases where the dimension L22 is 0.7 mm, 1.0 mm and 1.3 mm. In the example shown in FIG. 25, the dimension L22 is made relatively large to improve the performance of the semiconductor device A1. Note that the dimensions L11 and L12 each are 3.4 mm, the inner diameter D1 is 2.2 mm, and the dimension L21 is 0.9 mm. The first side surface 851, of the opening 851 is inclined 20 degrees with respect to the direction Z1. It is preferable that the antenna gain of the semiconductor device A1 is not less than 7 dB or 8 dB, for example. In the example shown in FIG. 25, the semiconductor device A1 exhibits the antenna gain of not less than 7 dB, for example, in any of the cases where the dimension L22 is 0.7 mm, 1.0 mm and 1.3 mm. For example, preferable results are exhibited when the frequency of the terahertz element is in the range of 300 to 330 GHz. However, frequencies of the terahertz element other than this range may be used. According to FIG. 25, the dimension L22 may be set to 0.6 to 0.8 mm, for example, in light of the results in the case where the dimension L22 is 0.7 mm. According to FIG. 25, the dimension L22 may be set to 0.9 to 1.1 mm, for example, in light of the results in the case where the dimension L22 is 1.0 mm. According to FIG. 25, the dimension L22 may be set to 1.2 to 1.4 mm, for example, in light of the results in the case where the dimension L22 is 1.3 mm. Also, the dimension L22 may be set to 0.6 to 1.4 mm.

The present disclosure is not limited to the foregoing embodiments. The specific configuration of each part of the present disclosure may be varied in many ways.

The above-described embodiments include the following clauses.

Clause 1.

A terahertz element comprising:

a semiconductor substrate;

a first conductive layer and a second conductive layer each famed on the semiconductor substrate and insulated from each other; and an active element famed on the semiconductor substrate and electrically connected to the first conductive layer and the second conductive layer, wherein the first conductive layer includes a first antenna part extending along a first direction, a first capacitor part positioned offset from the active element in a second direction as viewed in a thickness direction of the semiconductor substrate, and a first conductive part connected to the first capacitor part, the second direction being perpendicular to the thickness direction and the first direction, the second conductive layer includes a second capacitor part, the second capacitor part being stacked over the first capacitor part while being insulated from the first capacitor part, the semiconductor substrate includes an exposed part that is exposed from the first capacitor part and the second capacitor part, and the first conductive part has a portion that is spaced apart from the first antenna part in the second direction with the exposed part therebetween as viewed in the thickness direction.

Clause 2.
The terahertz element according to clause 1, wherein the second conductive layer includes a second antenna part extending along a third direction that is opposite to the first direction.

Clause 3.
The terahertz element according to clause 2, wherein the first conductive layer includes a first inductance part, the first inductance part being connected to the first antenna part and the first capacitor part while extending from the first antenna part to the first capacitor part along the second direction, and
the second conductive layer includes a second inductance part, the second inductance part being connected to the second antenna part and the second capacitor part while extending from the second antenna part to the second capacitor part along the second direction.

Clause 4.
The terahertz element according to clause 2 or 3, wherein the first capacitor part has a first capacitor-part side surface that is a side of the first capacitor part in the first direction,
the first capacitor-part side surface of the first capacitor part is offset in the third direction from an end of the first antenna part in the first direction,
the second capacitor part has a first capacitor-part side surface that is on a side of the second capacitor part in the first direction, and
the first capacitor-part side surface of the second capacitor part is offset in the third direction from the end of the first antenna part in the first direction.

Clause 5.
The terahertz element according to clause 4, wherein the first capacitor part has a second capacitor-part side surface that is on a side of the first capacitor part in the third direction,
the second capacitor-part side surface of the first capacitor part is offset in the first direction from an end of the second antenna part in the third direction,
the second capacitor part has a second capacitor-part side surface that is on a side of the second capacitor part in the third direction, and
the second capacitor-part side surface of the second capacitor part is offset in the first direction from the end of the second antenna part in the third direction.

Clause 6.
The terahertz element according to any of clauses 1-5, wherein the first capacitor part has a dimension in the first direction that is different from a dimension of the second capacitor part in the second direction.

Clause 7.
The terahertz element according to any of clauses 1-6, wherein the first conductive part has a first conductive-part side surface that is spaced apart from the first antenna part in the second direction, and
the first conductive-part side surface extends along the first direction.

Clause 8.
The terahertz element according to any of clauses 1-7, wherein the first conductive part has a portion held in direct contact with the semiconductor substrate.

Clause 9.
The terahertz element according to any of clauses 1-8, wherein the second conductive layer includes a second conductive part connected to the second capacitor part, and
the first conductive part is spaced apart from the second conductive part in the first direction.

Clause 10.
The terahertz element according to clause 1, wherein the first conductive part includes a first conductive section and a first extension extending out of the first conductive section,
the first extension is connected to the first capacitor part,
the second conductive part includes a second conductive section and a second extension extending out of the second conductive section, and
the second extension is connected to the second capacitor part.

Clause 11.
The terahertz element according to clause 3, wherein the second conductive layer includes a second conductive part disposed opposite to the first conductive part with the active element therebetween.

Clause 12.
The terahertz element according to clause 11, wherein an entirety of the first capacitor part overlaps with the first conductive part in the first direction.

Clause 13.
The terahertz element according to clause 11 or 12, wherein the first conductive layer includes a third capacitor part and a third inductance part,
the third capacitor part is positioned opposite to the first capacitor part with the first antenna part therebetween,
the third inductance part is connected to the first antenna part and the third capacitor part while extending from the third capacitor part to the first antenna part along the second direction,
the second conductive layer includes a fourth capacitor part and a fourth inductance part,
the fourth capacitor part is positioned opposite to the second capacitor part with the second antenna part therebetween, and
the fourth inductance part is connected to the second antenna part and the fourth capacitor part while extending from the fourth capacitor part to the second antenna part along the second direction.

Clause 14.
The terahertz element according to clause 1, further comprising an insulating layer interposed between the semiconductor substrate and each of the first conductive layer and the second conductive layer.

Clause 15.
The terahertz element according to clause 14, wherein a part of the insulating layer is interposed between the first capacitor part and the second capacitor part.

Clause 16.
A semiconductor device comprising:
a support;
a terahertz element as set forth in clause 1, the terahertz element being disposed on the support; and
an insulating part disposed on the support, wherein
the insulating part is famed with an opening in which the terahertz element is housed, and
the opening has a first side surface, the first side surface being inclined with respect to a thickness direction of the support.

Clause 17.
The semiconductor device according to clause 16, wherein the opening has a second side surface surrounding the terahertz element, the second side surface being positioned between the first side surface and the support in the thickness direction of the support, and
the second side surface extends along the thickness direction of the support.

Clause 18.

The semiconductor device according to clause 17, wherein the second side surface has a dimension in the thickness direction of the support that is larger than a dimension of the terahertz element in the thickness direction of the support.

Clause 19.

The semiconductor device according to clause 17 or 18, further comprising a metal layer famed on the first side surface.

Clause 20.

The semiconductor device according to any of clauses 16-19, further comprising a wire bonded to the terahertz element and the support.

The invention claimed is:

1. A semiconductor device comprising:
   a support;
   a terahertz element disposed on the support and configured to radiate an electromagnetic wave with a frequency in a terahertz band; and
   a case disposed on the support and having an opening in which the terahertz element is housed,
   wherein the opening comprises a first side surface which is inclined with respect to a thickness direction of the support,
   the opening comprises a second side surface surrounding the terahertz element and disposed between the first side surface and the support in the thickness direction of the support, and
   the second side surface extends along the thickness direction of the support.

2. The semiconductor device according to claim 1, wherein the second side surface is greater in size along the thickness direction of the support than the terahertz element.

3. The semiconductor device according to claim 1, wherein the second side surface has a size of 0.8 to 1.0 mm along the thickness direction of the support.

4. The semiconductor device according to claim 1, wherein the opening has an inner diameter of 1.7 to 2.3 mm.

5. The semiconductor device according to claim 1, wherein the first side surface has a size of 0.6 to 1.4 mm along the thickness direction of the support.

6. The semiconductor device according to claim 1, wherein the first side surface is inclined 20 degrees with respect to the thickness direction of the support.

7. The semiconductor device according to claim 1, further comprising a metal layer formed on the first side surface.

8. The semiconductor device according to claim 1, further comprising a wire bonded to the terahertz element and the support.

9. The semiconductor device according to claim 1, wherein the support comprises a glass epoxy board.

10. The semiconductor device according to claim 1, wherein the case contains an epoxy resin.

11. The semiconductor device according to claim 1, wherein the frequency of the electromagnetic wave radiated from the terahertz element is in a range of 300 to 330 GHz.

* * * * *